(12) United States Patent
Murata et al.

(10) Patent No.: US 10,656,466 B2
(45) Date of Patent: May 19, 2020

(54) WAVELENGTH CONVERSION SUBSTRATE, LIQUID-CRYSTAL ELEMENT, LIQUID-CRYSTAL MODULE, AND LIQUID-CRYSTAL DISPLAY DEVICE

(71) Applicant: SHARP KABUSHIKI KAISHA, Sakai, Osaka (JP)

(72) Inventors: Koji Murata, Sakai (JP); Masakazu Kamura, Sakai (JP); Takashi Katayama, Sakai (JP); Mitsuru Chida, Sakai (JP); Takuya Ootani, Sakai (JP); Emi Yamamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/060,907

(22) PCT Filed: Jan. 24, 2017

(86) PCT No.: PCT/JP2017/002308
§ 371 (c)(1),
(2) Date: Jun. 8, 2018

(87) PCT Pub. No.: WO2017/130949
PCT Pub. Date: Aug. 3, 2017

(65) Prior Publication Data
US 2018/0364525 A1 Dec. 20, 2018

(30) Foreign Application Priority Data
Jan. 27, 2016 (JP) .................................. 2016-013857

(51) Int. Cl.
*G02F 1/1335* (2006.01)
*G02F 1/13357* (2006.01)
(Continued)

(52) U.S. Cl.
CPC ..... *G02F 1/133621* (2013.01); *G02B 6/0025* (2013.01); *G02B 6/0026* (2013.01);
(Continued)

(58) Field of Classification Search
CPC ......... G02F 1/133621; G02F 1/133504; G02F 1/133528; G02F 1/1337; G02F 1/134363;
(Continued)

(56) References Cited

U.S. PATENT DOCUMENTS

2012/0325301 A1* 12/2012 Misawa ............... H01G 9/2031
136/255
2013/0075778 A1  3/2013 Nakanishi et al.
2017/0045651 A1* 2/2017 Bae .................... G02F 1/133553

FOREIGN PATENT DOCUMENTS

JP   2013-068883 A   4/2013

OTHER PUBLICATIONS

O. Buchnev et al., "Electro-optical control in a plasmonic metamaterial hybridised with a liquid-crystal cell", Optics Express 2013, vol. 21, p. 1633-1638.

* cited by examiner

*Primary Examiner* — Nathanael R Briggs
*Assistant Examiner* — William D Peterson
(74) *Attorney, Agent, or Firm* — ScienBiziP, P.C.

(57) ABSTRACT

A wavelength conversion substrate according to one aspect of the present invention includes: a first substrate having an optical transparency; and a light modulation unit provided on one surface of the first substrate and configured to modulate a spectrum of incident light in accordance with a polarization state of the incident light. The light modulation unit includes: a plurality of metallic structures periodically provided at intervals from one another on one surface of the first substrate and configured to exhibit plasmon resonance due to incident light; and a plurality of wavelength conver-
(Continued)

sion units provided so that at least some wavelength conversion units are adjacent to the plurality of metallic structures and comprising a wavelength converting material configured to emit light in a wavelength band different from a wavelength band of the incident light.

9 Claims, 27 Drawing Sheets

(51) Int. Cl.
  *F21V 8/00* (2006.01)
  *G02F 1/1337* (2006.01)
  *G02F 1/1343* (2006.01)
  *H01L 33/50* (2010.01)

(52) U.S. Cl.
  CPC ...... *G02F 1/1337* (2013.01); *G02F 1/133504* (2013.01); *G02F 1/133528* (2013.01); *G02F 1/134363* (2013.01); *G02B 6/0043* (2013.01); *G02B 6/0086* (2013.01); *G02F 2001/133548* (2013.01); *G02F 2001/133614* (2013.01); *G02F 2203/055* (2013.01); *H01L 33/502* (2013.01)

(58) Field of Classification Search
  CPC ... G02F 2203/055; G02F 2001/133614; G02F 2001/133548; G02B 6/0026; G02B 6/0025; G02B 6/0043; G02B 6/0086; H01L 33/502
  USPC .......................................................... 349/61
  See application file for complete search history.

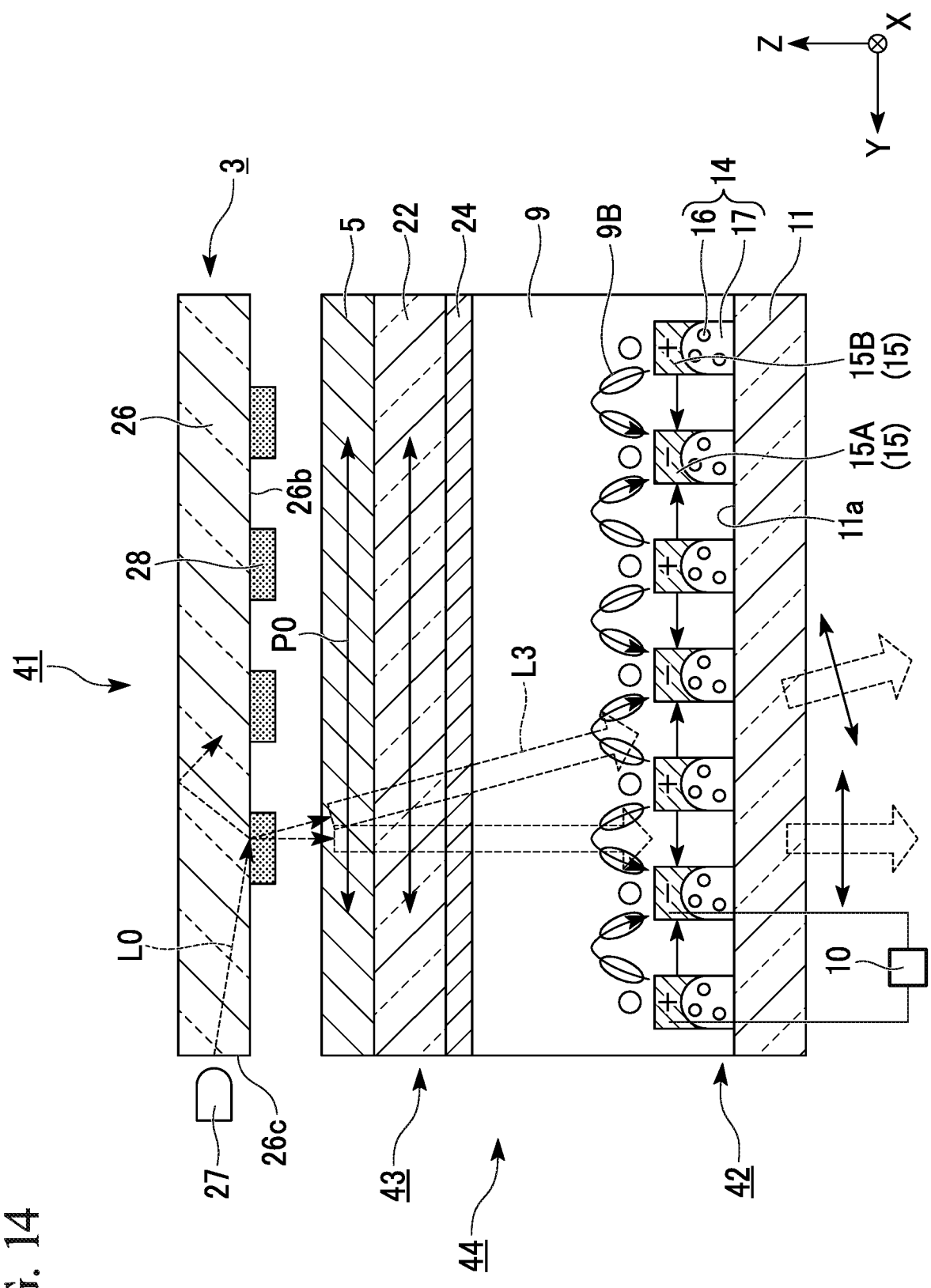

WAVELENGTH CONVERSION SUBSTRATE, LIQUID-CRYSTAL ELEMENT, LIQUID-CRYSTAL MODULE, AND LIQUID-CRYSTAL DISPLAY DEVICE

TECHNICAL FIELD

Some aspects of the present invention relate to a wavelength conversion substrate, a liquid-crystal element, a liquid-crystal module, and a liquid-crystal display device.

Priority is claimed on Japanese Patent Application No. 2016-013857, filed Jan. 27, 2016, the content of which is incorporated herein by reference.

BACKGROUND ART

The following Patent Document 1 discloses a light-transmissive metallic electrode having a metallic nanostructure in which openings of a nanometer order are periodically formed. Patent Document 1 discloses that localized surface plasmon resonance occurs and light of a specific wavelength is transmitted through a metallic electrode when linearly polarized light orthogonal to an extending direction of a linear part is incident on a metallic nanostructure having the linear part having a length approximately equal to the wavelength of the light.

Thus, an example in which a function of periodically arranged metallic nanostructures transmitting light of a specific wavelength is applied to a liquid-crystal element is disclosed in the following Non-Patent Document 1. In the liquid-crystal element disclosed in Non-Patent Document 1, a polarizer, a transparent electrode, an alignment film, and a color filter provided on one substrate in a general twisted nematic (TN) type liquid-crystal element are replaced with a metallic nanostructure. In this liquid-crystal element, by controlling an electric field between the metallic nanostructure and the transparent electrode on the other substrate side, switching can be performed between a mode in which incident light is transmitted regardless of a wavelength and a mode in which light of a specific wavelength band is transmitted.

PRIOR ART DOCUMENTS

Patent Documents

[Patent Document 1]
Japanese Unexamined Patent Application, First Publication No. 2013-68883
[Non-Patent Document 1]
[Non-Patent Document 1]
O. Buchnev et al., "Electro-optical control in a plasmonic metamaterial hybridised with a liquid-crystal cell," Optics Express 2013, Vol. 21, p. 1633-1638

SUMMARY OF INVENTION

Problem to be Solved by Invention

However, in the liquid-crystal element disclosed in Non-Patent Document 1, there is a problem that emitted light having a high intensity cannot be obtained in a mode in which light of a specific wavelength band is transmitted. Also, because plasmon absorbed light energy is deactivated as heat inside the metallic nanostructure, there is a problem that energy loss occurs and energy efficiency is low.

An objective of an aspect of the present invention is to provide a wavelength conversion substrate for implementing a liquid-crystal element capable of obtaining emitted light having a high intensity. Alternatively, an objective of an aspect of the present invention is to provide a wavelength conversion substrate for implementing a liquid-crystal element having high energy efficiency. Also, an objective of an aspect of the present invention is to provide a liquid-crystal element capable of obtaining emitted light having a high intensity. Also, an objective of an aspect of the present invention is to provide a liquid-crystal module and a liquid-crystal display device including the above liquid-crystal element.

Means for Solving the Problems

To achieve the above-described objective, a wavelength conversion substrate according to one aspect of the present invention includes: a first substrate having an optical transparency; and a light modulation unit provided on one surface of the first substrate and configured to modulate a spectrum of incident light in accordance with a polarization state of the incident light. The light modulation unit includes: a plurality of metallic structures periodically provided at intervals from one another on one surface of the first substrate and configured to exhibit plasmon resonance due to incident light; and a plurality of wavelength conversion units provided so that at least some wavelength conversion units are adjacent to the plurality of metallic structures and including a wavelength converting material configured to emit light in a wavelength band different from a wavelength band of the incident light.

In the wavelength conversion substrate according to the one aspect of the present invention, the wavelength conversion units may be provided between the metallic structures and the first substrate.

In the wavelength conversion substrate according to the one aspect of the present invention, surfaces of a side in contact with the metallic structures of the wavelength conversion units may have convex shapes toward the metallic structures.

In the wavelength conversion substrate according to the one aspect of the present invention, surfaces of a side in contact with the metallic structures of the wavelength conversion units may have planar shapes.

In the wavelength conversion substrate according to the one aspect of the present invention, the wavelength conversion units may be formed between adjacent metallic structures.

In the wavelength conversion substrate according to the one aspect of the present invention, a resonance wavelength of the plasmon resonance exhibited in the metallic structures may be within the absorption wavelength band of an absorption spectrum of the wavelength converting material.

In the wavelength conversion substrate according to the one aspect of the present invention, the material of the metallic structures may be any one of gold, silver, aluminum, platinum, copper, indium, indium tin oxide, rhodium, and ruthenium.

A liquid-crystal element according to one aspect of the present invention includes: the wavelength conversion substrate according to the one aspect of the present invention; a second substrate; a liquid-crystal layer provided between the wavelength conversion substrate and the second substrate; and an electric field generation unit configured to control an alignment state of liquid-crystal molecules inside the liquid-crystal layer by generating an electric field in the liquid-crystal layer.

In the liquid-crystal element according to the one aspect of the present invention, the second substrate may include an electrode, and the electric field generation unit may generate a vertical electric field between the metallic structures and the electrode.

In the liquid-crystal element according to one aspect of the present invention, the first substrate may include an electrode, and the electric field generation unit may generate a horizontal electric field between the metallic structures and the electrode.

A liquid-crystal module according to one aspect of the present invention includes: the liquid-crystal element according to the one aspect of the present invention; and a light source configured to radiate light to the liquid-crystal element.

A liquid-crystal display device according to one aspect of the present invention includes: the liquid-crystal module according to the one aspect of the present invention.

The liquid-crystal display device according to the one aspect of the present invention, the liquid-crystal display device may include: red, green, and blue sub-pixels, the material of the metallic structures may be made of any one of aluminum, indium, rhodium, and ruthenium, a period $\Lambda_R$ of the metallic structures in the red sub-pixels may be 500 nm<$\Lambda_R$<650 nm, a period $\Lambda_G$ of the metallic structures in the green sub-pixels may be 400 nm<$\Lambda_G$<550 nm, and a period $\Lambda_B$ of the metallic structures in the blue sub-pixels may be 200 nm<$\Lambda_B$<350 nm.

Effect of Invention

According to an embodiment of the present invention, it is possible to provide a wavelength conversion substrate for implementing a liquid-crystal element capable of obtaining emitted light having a high intensity. Also, according to an aspect of the present invention, it is possible to provide a wavelength conversion substrate for implementing a liquid-crystal element having high energy efficiency. Also, according to an aspect of the present invention, it is possible to provide a liquid-crystal element capable of obtaining emitted light having a high intensity. Also, according to an aspect of the present invention, it is possible to provide a liquid-crystal module and a liquid-crystal display device including the above liquid-crystal element.

BRIEF DESCRIPTION OF DRAWINGS

FIG. 14 is a cross-sectional view of a liquid-crystal display device according to a second embodiment.

EMBODIMENTS FOR CARRYING OUT INVENTION

[First Embodiment]

Hereinafter, a first embodiment of the present invention will be described with reference to FIGS. 1 to 13B.

Figure 1:
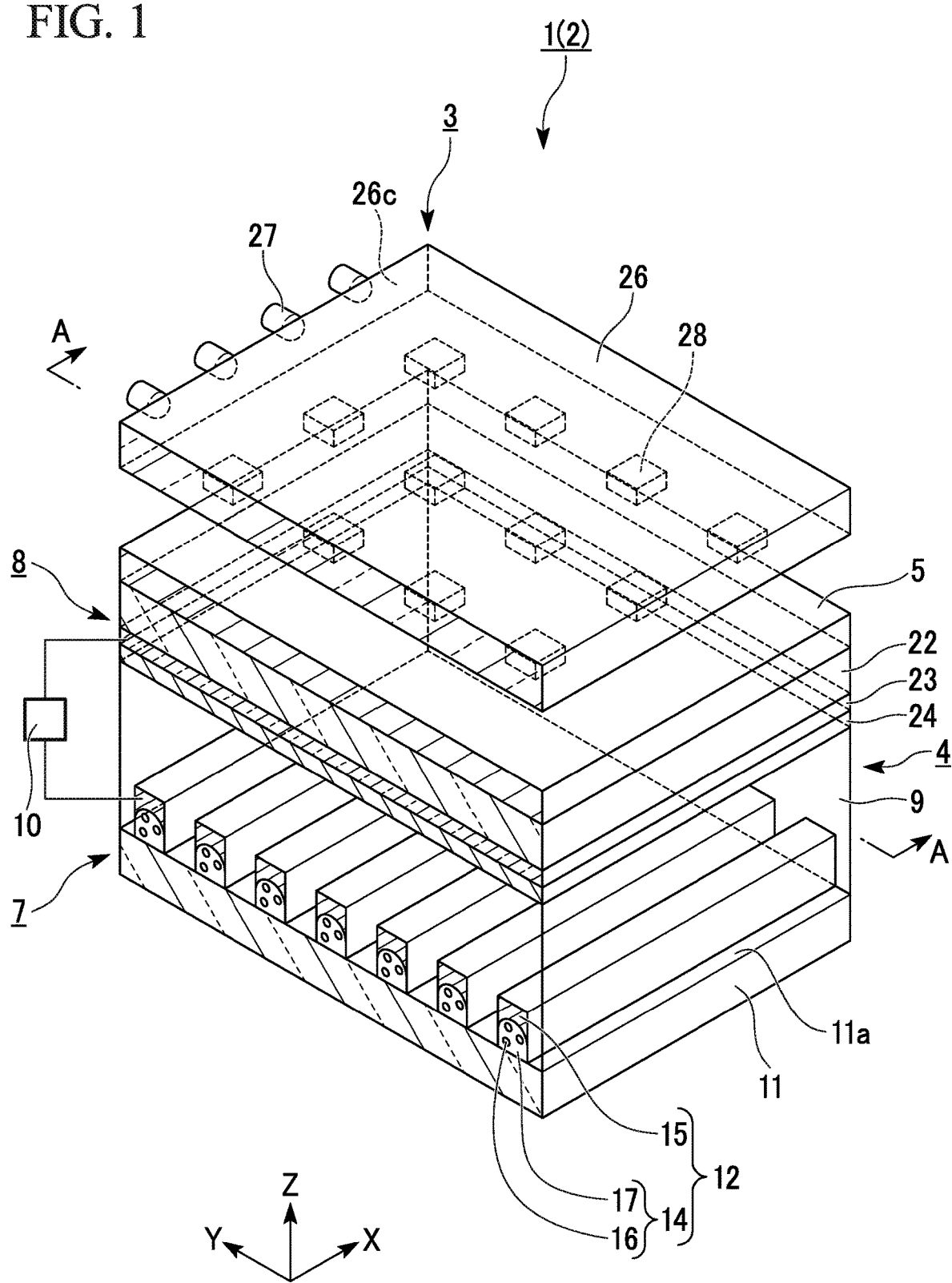
FIG. 1 is a perspective view of a liquid-crystal display device according to a first embodiment.
Figure 2:
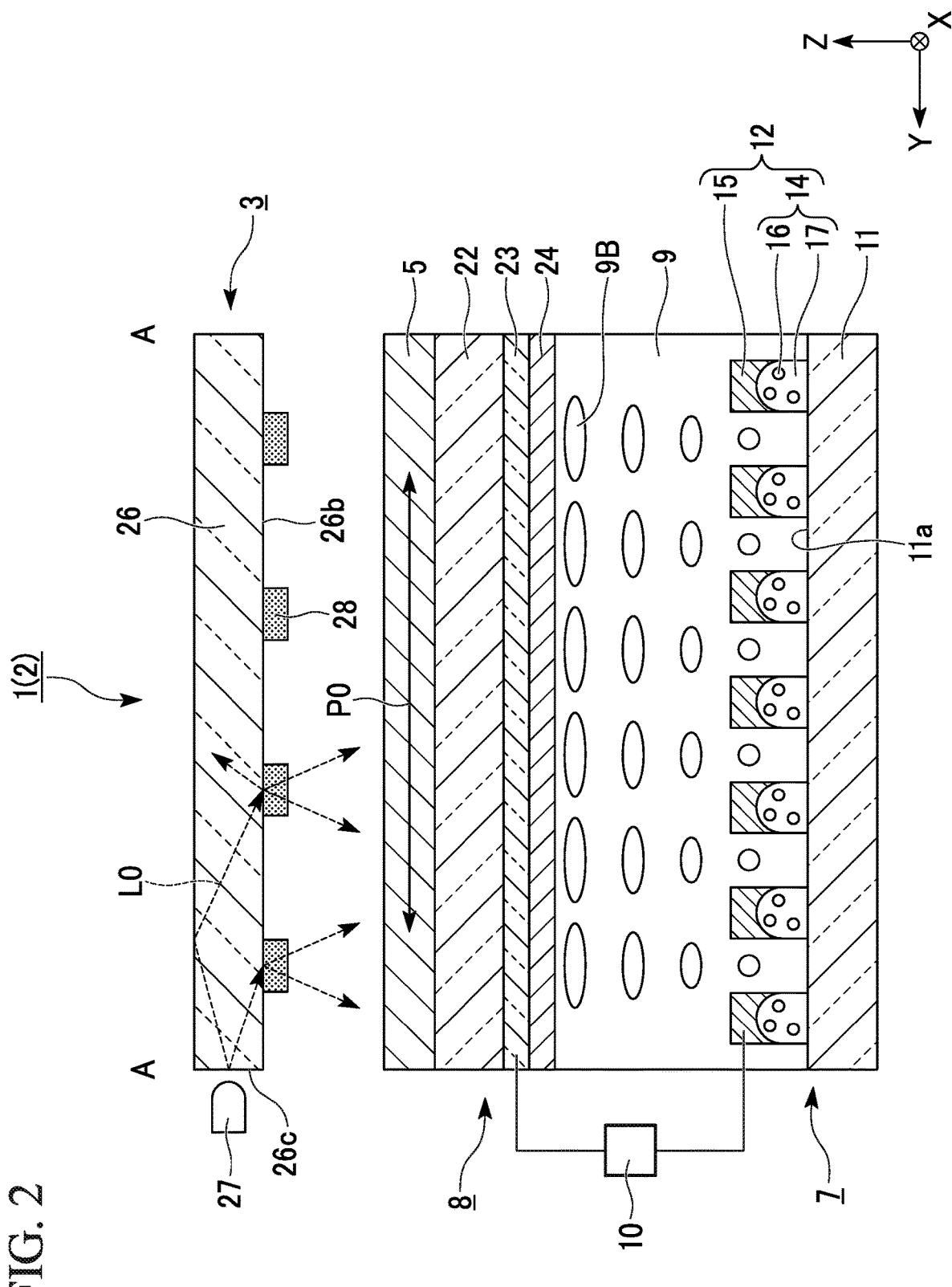
FIG. 2 is a cross-sectional view taken along the line A-A of FIG. 1.
Figure 3:
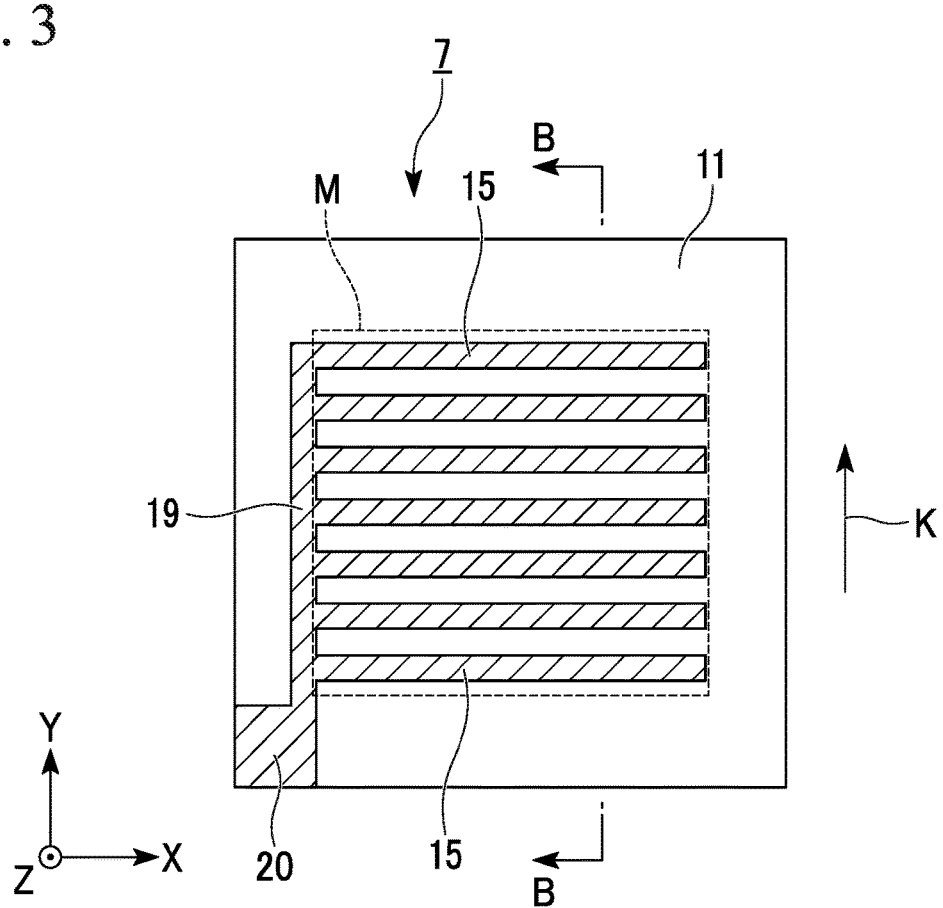
FIG. 3 is a plan view of a wavelength conversion substrate according to the first embodiment.
Figure 4:
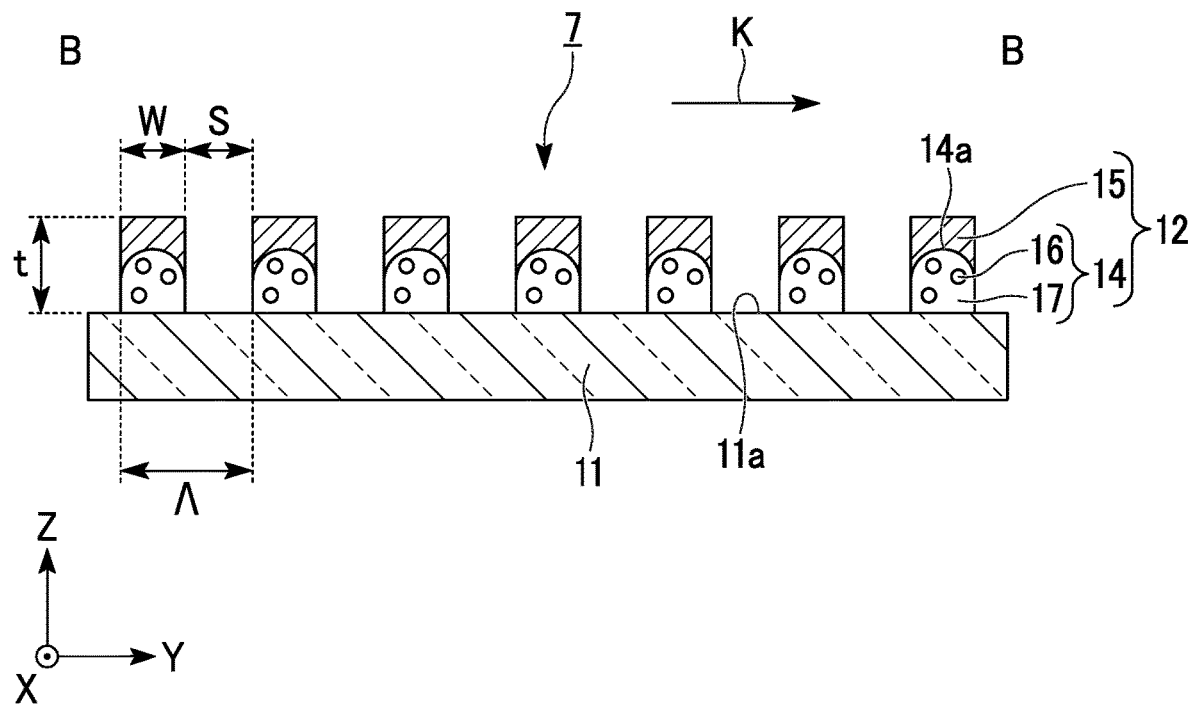
FIG. 4 is a cross-sectional view taken along the line B-B of FIG. 3.

FIG. 1 is a perspective view of a liquid-crystal display device according to the first embodiment. FIG. 2 is a cross-sectional view taken along the line A-A of FIG. 1. FIG. 3 is a plan view of a wavelength conversion substrate which is a constituent element of the liquid-crystal display device according to the first embodiment. FIG. 4 is a cross-sectional view taken along the line B-B of FIG. 3.

In the following drawings, in order to make constituent elements easy to see, the scales of dimensions may be differentiated according to the constituent elements.

As illustrated in FIGS. 1 and 2, the liquid-crystal display device 1 of the first embodiment includes a liquid-crystal module 2. The liquid-crystal module 2 includes a light source 3, a liquid-crystal element 4, and a polarizer 5. The light source 3 radiates white light toward the liquid-crystal element 4. The liquid-crystal element 4 is a TN type liquid-crystal element. Light emitted from the light source 3 is emitted from the liquid-crystal element 4 in accordance with an alignment state of a liquid-crystal layer within the liquid-crystal element 4. In the liquid-crystal module 2, by controlling the alignment state of the liquid-crystal layer, switching is performed between a state in which incident light from the light source 3 is transmitted regardless of a wavelength and a state in which light of a specific wavelength band is transmitted.

The polarizer 5 is provided between the light source 3 and the liquid-crystal element 4. That is, the polarizer 5 is provided on a light incidence side of the liquid-crystal element 4. On the other hand, the polarizer 5 is not provided on a light emission side of the liquid-crystal element 4. Thus, because the liquid-crystal display device 1 cannot block light on the light emission side of the liquid-crystal element 4, it is not possible to display black. Therefore, the display is configured by controlling either a state in which light of the entire wavelength band within the light emitted from the light source 3 is transmitted or a state in which light of a specific wavelength band is transmitted. For the polarizer 5, a general polarizing plate can be used. The polarizer 5 is arranged so that a transmission axis P0 is orthogonal to metallic structures 15 to be described below.

Hereinafter, in order to simplify the description, a state in which incident light from the light source 3 is transmitted regardless of a wavelength is referred to as a "full transmission state" and a state in which light of a specific wavelength band within incident light from the light source 3 is transmitted is referred to as a "specific wavelength band transmission state."

The liquid-crystal display device 1 includes a plurality of pixels arranged in a matrix shape.

However, in FIGS. 1 to 4, only one of the plurality of pixels is illustrated as a representative. Thus, within one pixel illustrated in FIG. 1 and FIG. 2, the liquid-crystal element 4 is in one of the full transmission state or the specific wavelength band transmission state. That is, a plurality of pixels having either one of the full transmission state and the specific wavelength band transmission state are arranged in a matrix shape to form the display of the liquid-crystal display device 1.

An observer of the liquid-crystal display device 1 can view the display from a side opposite a side where the light source 3 of the liquid-crystal element 4 is provided (a lower side in FIGS. 1 and 2).

The liquid-crystal element 4 includes a wavelength conversion substrate 7, a counter substrate 8, a liquid-crystal layer 9, and an electric field generation unit 10. The liquid-crystal element 4 is provided between the wavelength conversion substrate 7 and the counter substrate 8. The electric field generation unit 10 controls an alignment state of liquid-crystal molecules in the liquid-crystal layer 9 by generating an electric field in the liquid-crystal layer 9.

The wavelength conversion substrate 7 includes a first substrate 11 and a light modulation unit 12. The first substrate 11 preferably includes a material having high optical transparency, and includes, for example, a glass substrate or the like. The light modulation unit 12 is provided on one surface 11a of the first substrate 11 and modulates a spectrum of the incident light in accordance with a polarization state of the incident light.

The light modulation unit 12 includes a plurality of wavelength conversion units 14 and the plurality of metallic structures 15.

The plurality of metallic structures 15 are periodically arranged at intervals from one another on one surface 11a of the first substrate 11. Also, each of the plurality of wavelength conversion units 14 is provided at least partially adjacent to one of the plurality of metallic structures 15. In the first embodiment, the wavelength conversion units 14 are provided between the metallic structures 15 and the first substrate 11. The wavelength conversion units 14 include a wavelength converting material 16 and a dielectric material 17 containing the wavelength converting material 16.

Also, although the wavelength conversion units 14 include the dielectric material 17 containing the wavelength converting material 16 in the first embodiment, the wavelength conversion units 14 may include a vapor deposited film of the wavelength converting material 16, a polymer fluorescent substance, or the like instead of this configuration.

As illustrated in FIG. 3, the metallic structures 15 extend in one direction (an X direction). The plurality of metallic structures 15 are provided in parallel to one another at predetermined intervals in a direction orthogonal to the extending direction of the metallic structure 15 (a Y direction). The plurality of metallic structures 15 are connected by a connection part 19 extending in a direction orthogonal to the metallic structures 15 at one end part of the metallic structure 15. At one end part of the connection part 19, an electrode pad unit 20 is provided. When a potential is applied to the electrode pad unit 20, the plurality of metallic structures 15 have substantially the same potential. As described above, the plurality of metallic structures 15 have a comb-like shape and function as one electrode of a pair of electrodes for controlling the alignment state of liquid-crystal molecules. A region M in which the plurality of metallic structures 15 are provided serves as an effective display region substantially contributing to display.

An arrow K illustrated in FIGS. 3 and 4 is a grating vector. The grating vector K is a vector orthogonal to the extending direction of the metallic structures 15 and in a direction parallel to the one surface 11a of the first substrate 11.

As illustrated in FIG. 4, surfaces 14a of the wavelength conversion units 14 on a side in contact with the metallic structures 15 have convex shapes toward the metallic structures 15. In the case of the first embodiment, the surfaces 14a of the wavelength conversion units 14 on the side in contact with the metallic structures 15 have hemispherical shapes. The metallic structures 15 are provided to cover the hemispherical surfaces on an upper side of the wavelength conversion units 14. As examples of dimensions of the metallic structures 15, a period Λ of the metallic structures 15 is Λ=300 nm. Widths W of the metallic structures 15 are W=150 nm. Distances S between adjacent metallic structures 15 are S=150 nm. Heights t of the metallic structures are t=230 nm.

The wavelength converting material 16 includes, for example, a fluorescent material, a phosphor material, or the like. In the first embodiment, the fluorescent material is used as the wavelength converting material 16. As the fluorescent material, it is preferable to use one having a plasmon resonance wavelength to be described below within an absorption wavelength band of the fluorescent material. For example, Lumogen Red 305 which is a red fluorescent substance is used as the fluorescent material.

As the dielectric material 17, it is preferable to use inorganic materials such as silica and titania having optical transparency and excellent light resistance. In the first embodiment, silica is used. A refractive index of silica is 1.45.

For the metallic structures 15, a metallic material having high electric conductivity and configured to exhibit plasmon resonance by incidence of light is used. As the metallic material, it is preferable to use a metallic material having a plasmon resonance wavelength in a visible range. Specifically, for example, gold, silver, aluminum, platinum, copper, indium, indium tin oxide (ITO), rhodium, ruthenium or the like is used as the metallic material. As the metallic material, gold is used in the first embodiment.

As illustrated in FIGS. 1 and 2, the counter substrate 8 includes a second substrate 22, a transparent electrode 23, and an alignment film 24. Similar to the first substrate 11, the second substrate 22 preferably includes a transparent substrate having high optical transparency. The second substrate 22 includes, for example, glass or the like.

The transparent electrode 23 is provided on the entire surface of the second substrate 22. The transparent electrode 23 preferably includes a transparent conductive material having high optical transparency such as ITO or indium zinc oxide (IZO). In the first embodiment, IZO having a film thickness of 100 nm is used as the transparent electrode 23.

The alignment film 24 is provided to cover the transparent electrode 23 on the entire surface of the second substrate 22. As the material of the alignment film 24, for example, an organic film such as polyimide is used. For example, a rubbing method is used as alignment processing, and uniaxial horizontal alignment processing is applied to the alignment film 24. In the first embodiment, an alignment direction of the alignment film 24 is defined as a direction (a Y direction) orthogonal to the extending direction of the metallic structures 15 on the wavelength conversion substrate 7. As the material of the alignment film 24, for example, an inorganic film such as a silicon oxide film may be used. The alignment processing is not particularly limited to the rubbing method, and well-known technologies such as optical alignment methods can be used.

As the material of the liquid-crystal layer 9, for example, an E7 liquid crystal (manufactured by Merck KGaA) which is one type of positive liquid-crystal material is used. An average refractive index n of the E7 liquid crystal is n=1.63 (ordinary light refractive index: 1.52 and extraordinary light refractive index: 1.75). The liquid-crystal layer 9 is a TN type liquid-crystal layer in which liquid-crystal molecules are twisted 90° and aligned between the wavelength conversion substrate 7 and the counter substrate 8. A thickness of the liquid-crystal layer 9 is about 15 μm.

As illustrated in FIGS. 1 and 2, the electric field generation unit 10 is connected to the metallic structures 15 and the transparent electrode 23. The electric field generation unit 10 generates an electric field in the liquid-crystal layer 9 by applying a voltage between the metallic structures 15 and the transparent electrode 23. Thereby, the alignment state of the liquid-crystal molecules 9B in the liquid-crystal layer 9 is controlled. Although detailed description thereof will be omitted, the electric field generation unit 10 includes a power supply, a control circuit for controlling an applied voltage to each electrode, a timing, or the like, and the like.

The light source 3 includes a light guide plate 26 and a plurality of light emitting elements 27. For example, the light guide plate 26 includes a plate material made of a resin having high optical transparency such as an acrylic plate. As the light emitting elements 27, light emitting diodes (LEDs) configured to emit white light are used. The plurality of light emitting elements 27 are provided at intervals on one end surface 26c of the light guide plate 26. Also, the light source 3 is not limited to the above configuration and can be appropriately changed.

As illustrated in FIG. 2, light L0 emitted from the light emitting elements 27 is incident from the end surface 26c of the light guide plate 26, and then propagates inside the light guide plate 26 while being totally reflected. On a surface 26b of the light guide plate 26 facing the polarizer 5, a plurality of light diffusion units 28 are provided at intervals. When the light L0 propagating inside the light guide plate 26 reaches the light diffusion units 28, the light L0 is diffused by the light diffusion units 28 and emitted from the light guide plate 26. For example, the light diffusion units 28 are preferably provided at such a distance that the back side of the light guide plate 26 can be seen through when the light guide plate 26 is viewed from the side where the light diffusion units 28 are provided.

The metallic structures 15 exhibit plasmon resonance when light is incident on the metallic structures 15 under specific conditions. The condition for the metallic structures 15 to exhibit the plasmon resonance is that in which the parameters of the metallic structures 15 and their surrounding components satisfy the following Equation (1).

$$k_{sp} = k_0 \sin \theta + mK \tag{1}$$

Here, $k_{sp}$ denotes a plasmon wavenumber, $k_0 \sin\theta$ denotes a wavenumber in the interface direction of incident light, m is an integer (0, ±1, ±2, ... ), and K is a grating vector.

The grating vector K is K=2 Π/Λ.

Here, Λ is a period of the metallic structures 15.

In other words, the condition for the metallic structures 15 to exhibit plasmon resonance is determined by parameters including the period Λ and a relative dielectric constant of the metallic structures 15, an incident angle and a wavelength of incident light, and a relative dielectric constant of the dielectric material 17 in contact with the metallic structures 15. Although detailed description thereof will be omitted, all these parameters are included in Equation (1). Therefore, the plasmon wavenumber $k_{sp}$ can be obtained if the above parameters are determined and the plasmon resonance wavelength $\lambda_{sp}$ can be obtained from the plasmon wavenumber $k_{sp}$.

Figure 5:
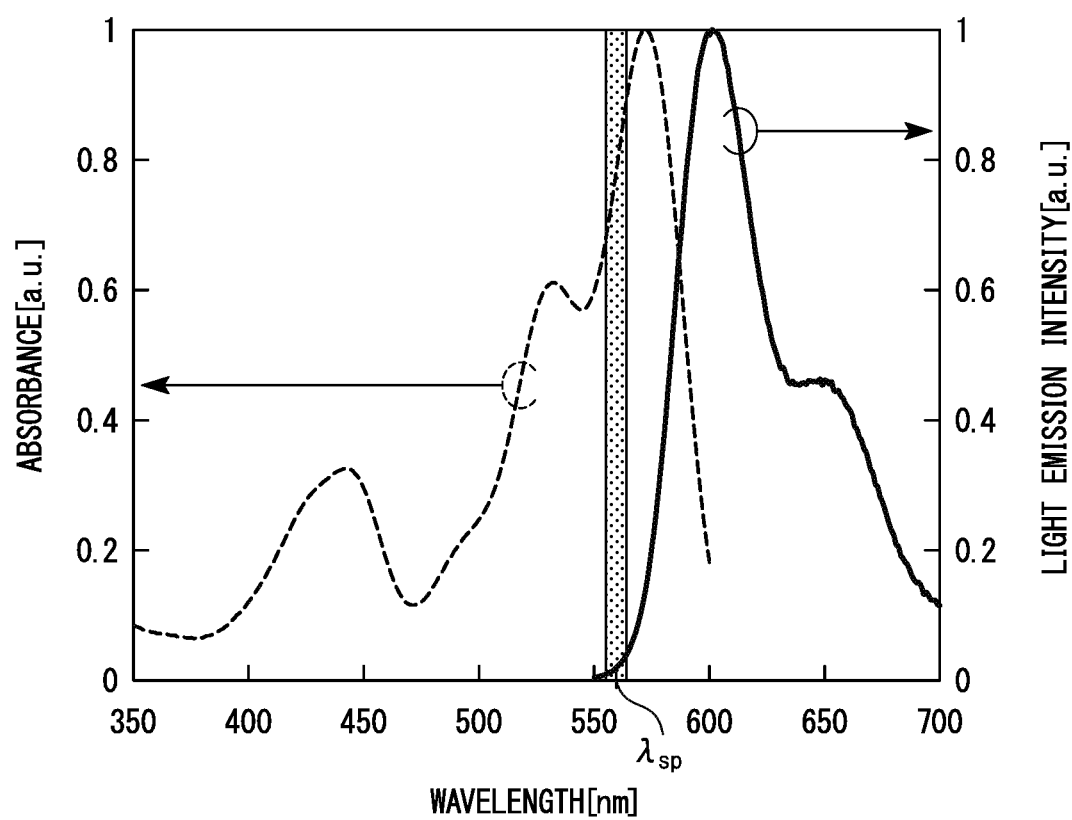
FIG. 5 is a diagram illustrating an absorption spectrum and an emission spectrum of a red fluorescent substance used in a liquid-crystal display device.

FIG. 5 is a diagram illustrating an absorption spectrum and an emission spectrum of Lumogen Red 305 which is the wavelength converting material 16 used in the first embodiment. In FIG. 5, the horizontal axis represents a wavelength [nm], the left vertical axis represents absorbance [a. u.], and the right vertical axis represents a light emission intensity [a. u.]. A graph of a broken line indicates an absorption spectrum, and a graph of a solid line indicates an emission spectrum.

An absorption spectrum of Lumogen Red 305 has an absorption wavelength band in a range of about 350 nm to about 600 nm and a peak with a wavelength of about 570 nm as an absorption maximum wavelength. Also, an emission spectrum of Lumogen Red 305 has an emission wavelength band in a range of about 550 nm to about 700 nm, and a peak with a wavelength of about 600 nm as the light emission maximum wavelength. Here, in the case of the first embodiment, the plasmon resonance wavelength $\lambda_{sp}$ obtained from the above Equation (1) is about 565 nm. The plasmon resonance wavelength $\lambda_{sp}$ of 565 nm is within the absorption wavelength band of the absorption spectrum of Lumogen Red 305. Realistically, the period $\Lambda$ of the metallic structures satisfying this condition is 50 nm<$\Lambda$<350 nm. In the first embodiment, $\Lambda$=300 nm is used.

Figure 6A:
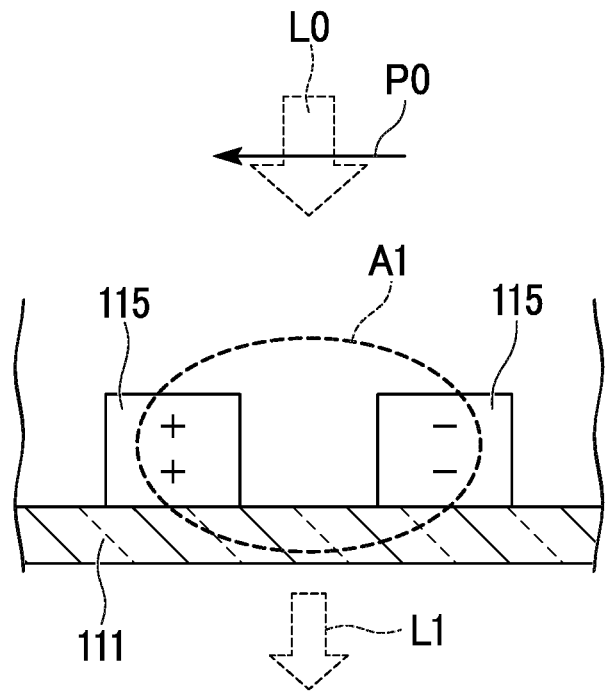
FIG. 6A is a view illustrating an operation of a metallic structure in a conventional liquid-crystal element.

FIG. 6A is a view illustrating the operation of the metallic structures 115 in the conventional liquid-crystal element.

Figure 7A:
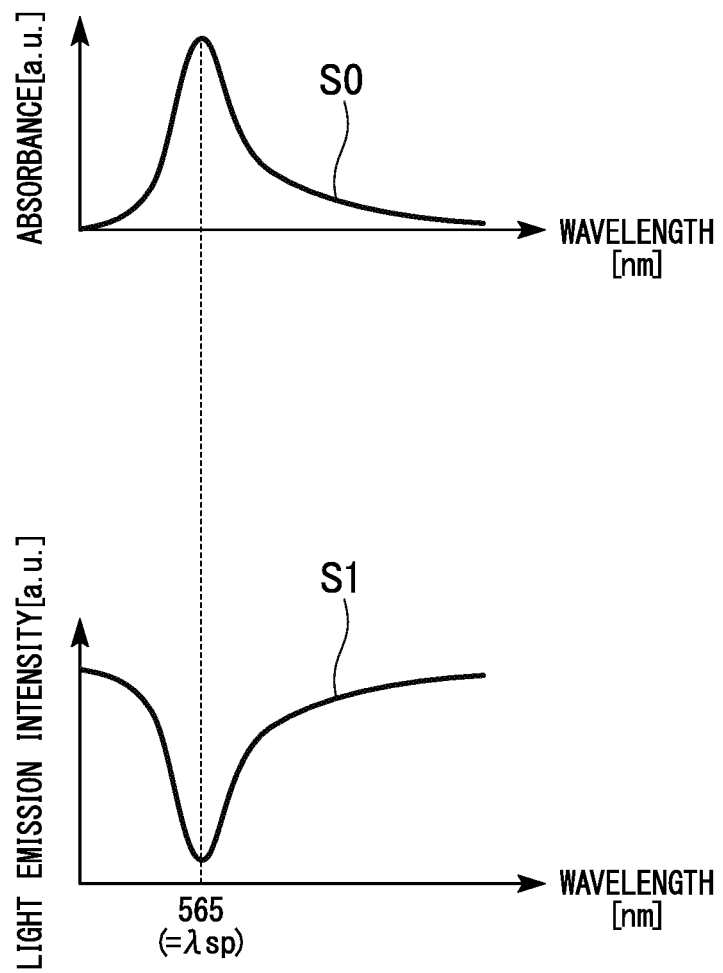
FIG. 7A is a diagram illustrating an absorption spectrum and an emission spectrum in a conventional liquid-crystal element.

The upper part of FIG. 7A shows an absorption spectrum S0 of the metallic structures 115 in the conventional liquid-crystal element and the lower part of FIG. 7A shows an emission spectrum S1 from the metallic structures 115 in the conventional liquid-crystal element. However, the conditions of the metallic structures 115 are the same as those of the first embodiment.

In the conventional liquid-crystal element, as illustrated in FIG. 6A, a case in which light L0 having a polarization direction P0 coincident with a direction perpendicular to the extending direction of the metallic structures 115 is incident on the metallic structures 115 is considered.

In this case, plasmon absorption having the plasmon resonance wavelength $\lambda_{sp}$ of about 565 nm as a central wavelength occurs as shown in the upper part of FIG. 7A and an enhanced electric field is formed in a region A1 in the vicinity of the metallic structures 115 as illustrated in FIG. 6A. As a result, as shown in the lower part of FIG. 7A, light L1 (light of a specific wavelength band) other than that of the absorption wavelength band having the plasmon resonance wavelength of about 565 nm as the central wavelength is transmitted through the metallic structures 115 and emitted from the first substrate 111.

On the other hand, FIG. 6A is a diagram illustrating an operation of the metallic structures 15 in the liquid-crystal element 4 of the first embodiment. The upper part of FIG. 7B shows an absorption spectrum S0' of the metallic structures 15 in the liquid-crystal element 4 of the first embodiment, the middle part of FIG. 7B shows an absorption spectrum S3 and an emission spectrum S2 of the wavelength converting material 16 (Lumogen Red 305) in the liquid-crystal element 4 of the first embodiment, and the lower part of FIG. 7B shows a spectrum S1+S2 of light emitted from the metallic structures 15 in the liquid-crystal element 4 of the first embodiment.

Figure 6B:
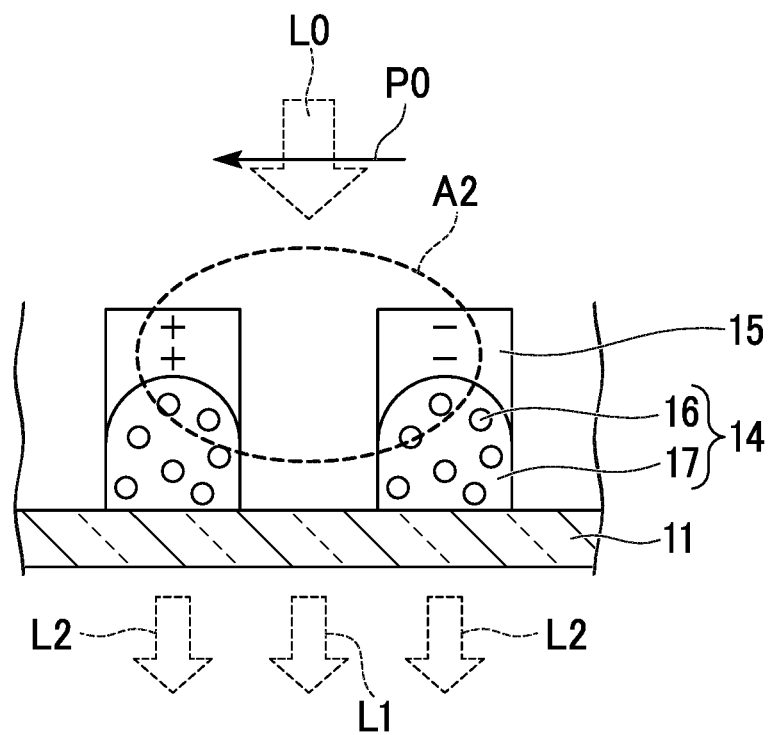
FIG. 6B is a diagram illustrating an operation of a wavelength conversion unit in the liquid-crystal element according to the first embodiment.

In the liquid-crystal element 4 of the present embodiment, as illustrated in FIG. 6B, a case in which light L0 having a polarization direction P0 coincident with the direction perpendicular to the extending direction of the metallic structures 15 is incident on the metallic structures 15 is considered.

Figure 7B:
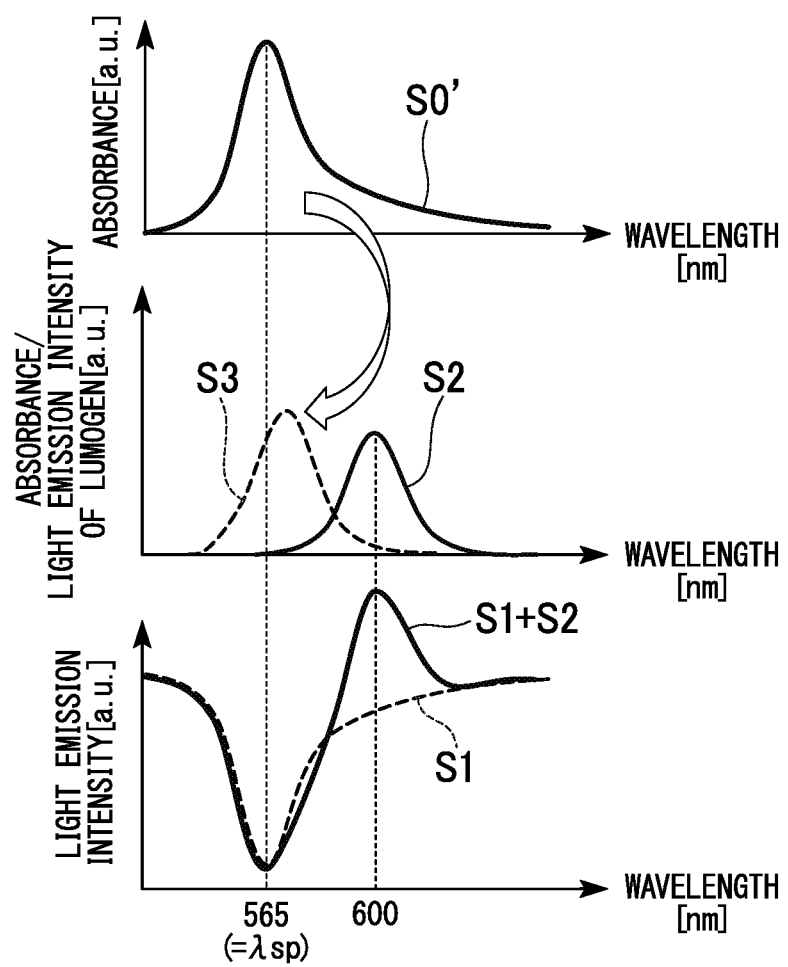
FIG. 7B is a view illustrating an absorption spectrum and an emission spectrum in the liquid-crystal element according to the first embodiment.

In this case, as shown in the upper part of FIG. 7B, plasmon absorption having the plasmon resonance wavelength $\lambda_{sp}$ of about 565 nm as a central wavelength occurs, and an enhanced electric field is formed in a region A2 in the vicinity of the metallic structures 15. At this time, in the case of the first embodiment, because the wavelength conversion units 14 (the wavelength converting material 16) are immediately below the metallic structures 15, the enhanced electric field formed by plasmon absorption acts on the wavelength converting material 16. Here, as shown in the middle part of FIG. 7B, because the plasmon resonance wavelength $\lambda_{sp}$ is within the absorption wavelength band of the wavelength converting material 16 (Lumogen Red 305), the energy of the incident light is moved to the wavelength converting material 16 via an enhanced electric field due to plasmons and is absorbed by the wavelength converting material 16.

Due to this energy movement, fluorescence emission occurs in the emission wavelength band having an emission wavelength of, for example, about 600 nm, as the central wavelength in the wavelength converting material 16. As a result, light L1 other than the wavelength band absorbed by the plasmon resonance and light L2 emitted from the wavelength converting material 16 are summed as illustrated in FIG. 6B and light with an increased intensity near a wavelength of 600 nm is emitted from the metallic structures 15 as indicated by the spectrum S1+S2 as illustrated in the lower part of FIG. 7B.

Isotropic light emission occurs in the wavelength converting material 16 and light is emitted in all directions.

However, because the metallic structures 15 are laminated above the wavelength conversion units 14, light traveling from the wavelength converting material 16 to a side opposite the first substrate 11 (an upper side of FIG. 6B) is reflected by the metallic structures 15 and travels toward the first substrate 11. As a result, most of the light emitted from the wavelength converting material 16 is transmitted through the first substrate 11 and emitted from the first substrate 11.

In the liquid-crystal display device 1 of the first embodiment, an electric field generated in the liquid-crystal layer 9 is controlled by the electric field generation unit 10, and an alignment state of the liquid-crystal molecules 9B is controlled. Because the electric field is generated between the metallic structures 15 on the wavelength conversion substrate 7 side and the transparent electrode 23 on the counter substrate 8 side, a direction of the electric field substantially coincides with a thickness direction of the liquid-crystal layer 9. That is, in the case of the first embodiment, a vertical electric field is generated in the liquid-crystal layer 9.

Hereinafter, a state in which no electric field is generated in the liquid-crystal layer 9 is referred to as an electric field OFF state and a state in which an electric field is generated in the liquid-crystal layer 9 is referred to as an electric field ON state.

Figure 8A:
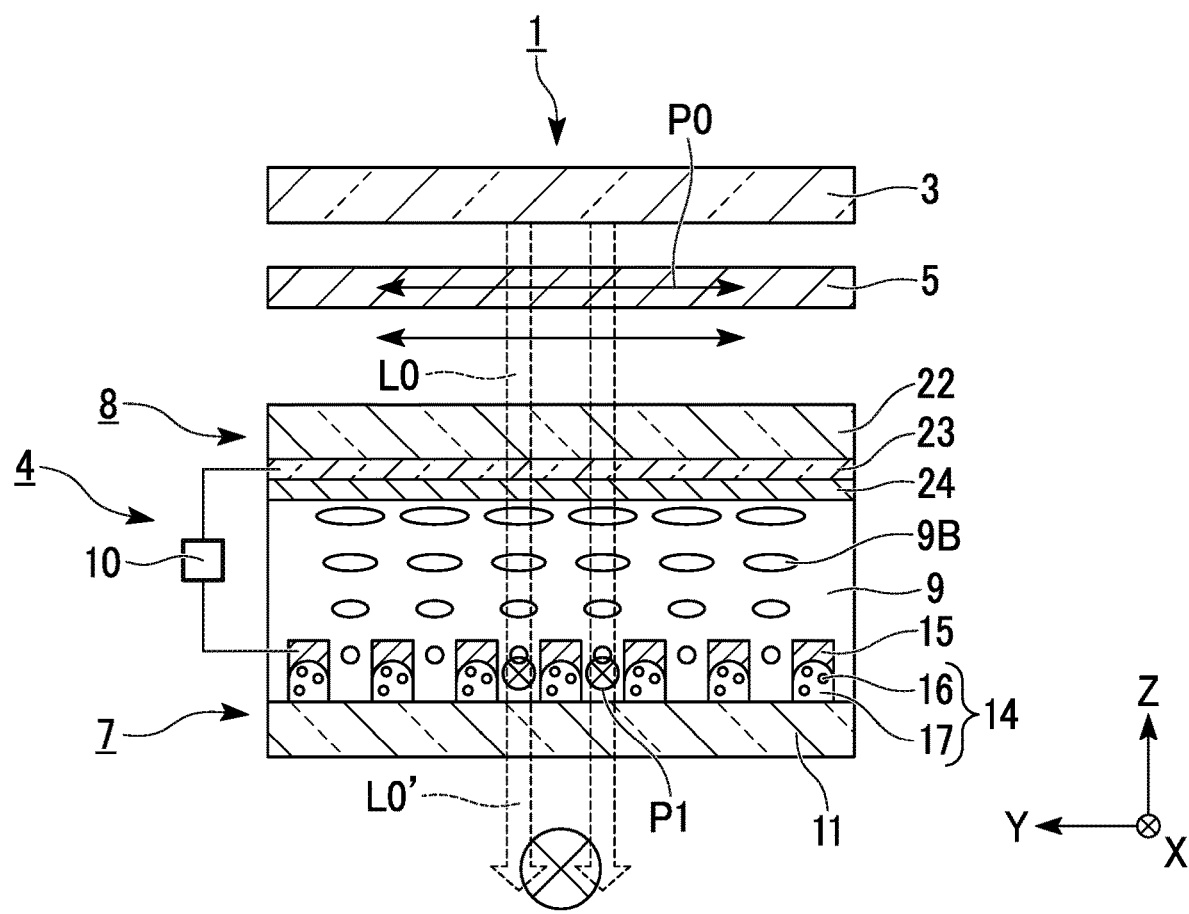
FIG. 8A is a diagram illustrating the behavior of light in a full transmission state in the liquid-crystal element of the first embodiment.

In the electric field OFF state, liquid-crystal molecules 9B constituting the liquid-crystal layer 9 are twisted 90° and aligned between the wavelength conversion substrate 7 and the counter substrate 8 as illustrated in FIG. 8A. Thus, light L0 having the polarization direction P0 parallel to the sheet surface of FIG. 8A within the light emitted from the light source 3 is transmitted through the counter substrate 8 and the liquid-crystal layer 9 after being transmitted through the polarizer 5 and becomes light L0' having a polarization direction P1 perpendicular to the sheet surface when the light L0 reaches the metallic structures 15. As described above, the light L0' is transmitted through the metallic structures 15 regardless of a wavelength.

Figure 8B:
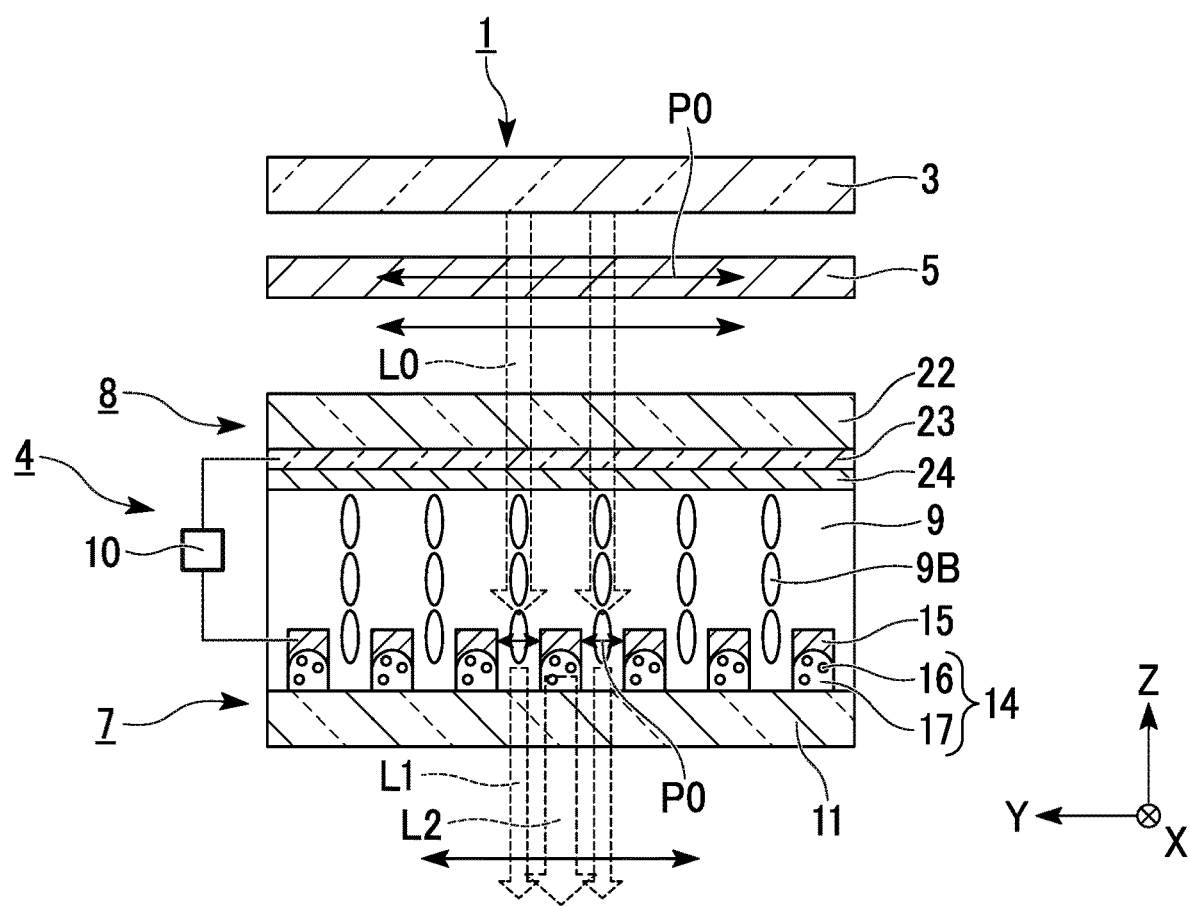
FIG. 8B is a diagram illustrating the behavior of light in a specific wavelength band transmission state in the liquid-crystal element according to the first embodiment.

On the other hand, in the electric field ON state, the liquid-crystal molecules 9B constituting the liquid-crystal layer 9 are arranged substantially perpendicular to one surface of each substrate between the wavelength conversion substrate 7 and the counter substrate 8 as illustrated in FIG. 8B. Thus, the polarization direction of the light L0 having the polarization direction P0 parallel to the sheet surface of FIG. 8B within the light emitted from the light source 3 remains as the polarization direction P0 parallel to the sheet surface even when the light L0 is transmitted through the polarizer 5, transmitted through the counter substrate 8 and transmitted through the liquid-crystal layer 9 and reaches the metallic structures 15.

Because this light has the polarization direction P0 perpendicular to the extending direction of the metallic structures 15, plasmon resonance occurs in the metallic structures 15 due to the light as described above. At this time, light L1 (light of a specific wavelength band) other than that of the absorption wavelength band whose central wavelength is a plasmon resonance wavelength is transmitted through the metallic structures 15. On the other hand, the wavelength converting material 16 emits light according to energy of the enhanced electric field due to plasmon resonance, and light L2 is emitted from the wavelength conversion units 14.

In this manner, in the liquid-crystal display device 1 of the first embodiment, the liquid-crystal element 4 is controlled so that the liquid-crystal element 4 is set to the full transmission state in the electric field OFF state and set to the specific wavelength band transmission state in the electric field ON state. Particularly, because light having a high intensity obtained by summing light L1 other than that of the wavelength band absorbed by the plasmon resonance and light L2 emitted from the wavelength converting material is emitted from the metallic structures 15 in the case of the specific wavelength band transmission state, it is possible to obtain emitted light with a higher intensity than in the past. Also, because energy absorbed during plasmon resonance moves to the wavelength converting material 16 and contributes to light emission, a liquid-crystal display device having high energy efficiency can be implemented.

Hereinafter, a first manufacturing method of the wavelength conversion substrate 7 having the above structure will be described.

Figure 9A:
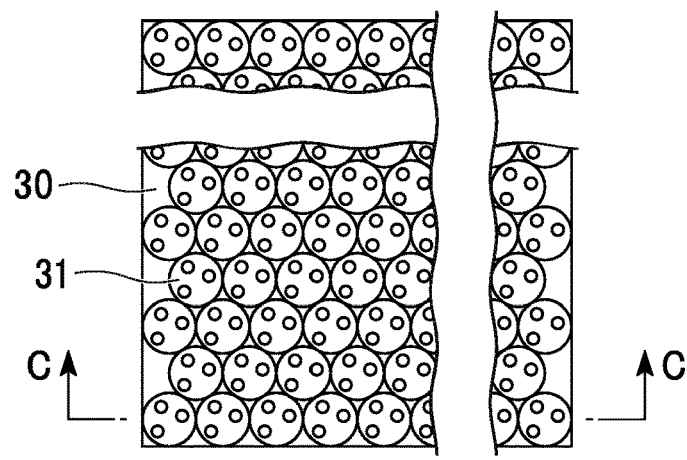
FIG. 9A is a first plan view illustrating a first manufacturing method of the wavelength conversion substrate according to the first embodiment in the order of steps.
Figure 9B:
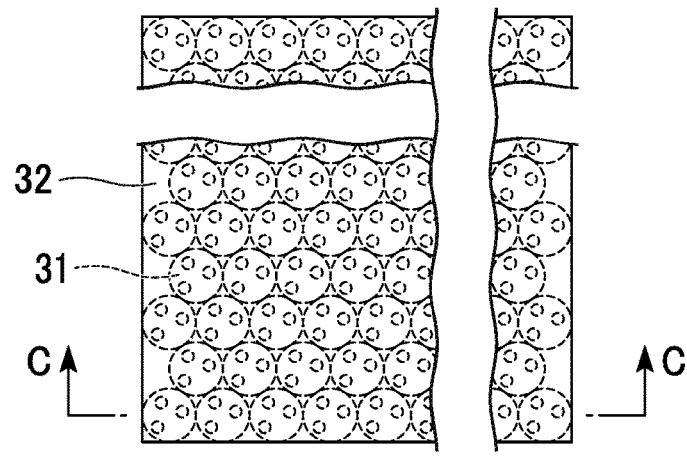
FIG. 9B is a second plan view illustrating the first manufacturing method of the wavelength conversion substrate according to the first embodiment in the order of steps.
Figure 9C:
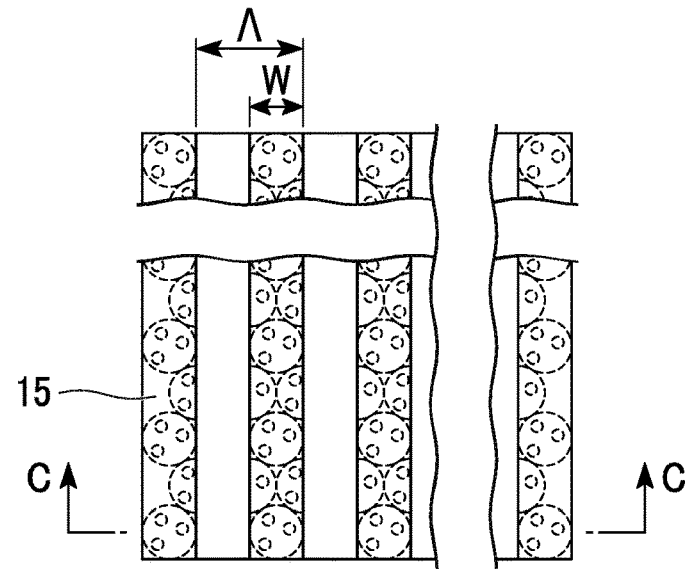
FIG. 9C is a third plan view illustrating the first manufacturing method of the wavelength conversion substrate according to the first embodiment in the order of steps.
Figure 10A:
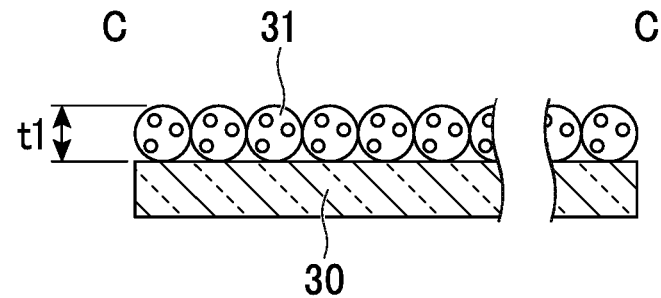
FIG. 10A is a cross-sectional view taken along the line C-C of FIG. 9A.
Figure 10B:
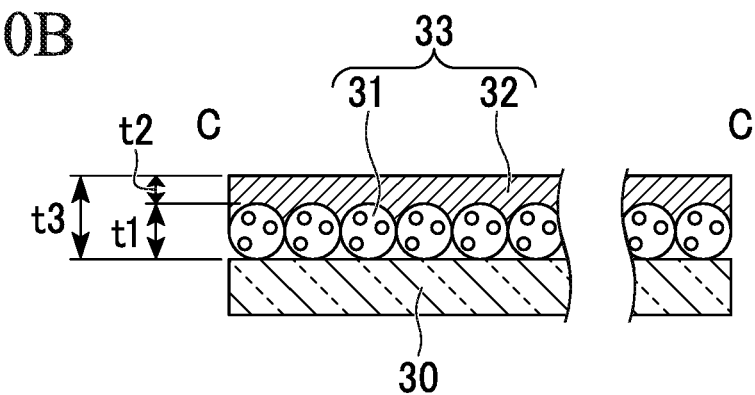
FIG. 10B is a cross-sectional view taken along the line C-C of FIG. 9B.
Figure 10C:
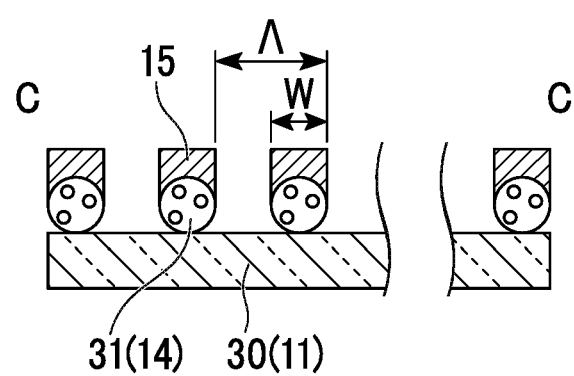
FIG. 10C is a cross-sectional view taken along the line C-C of FIG. 9C.

FIGS. 9A to 9C are plan views illustrating the first manufacturing method of the wavelength conversion substrate 7 of the present embodiment in the order of steps. FIGS. 10A to 10C are cross-sectional views taken along the line C-C of FIGS. 9A to 9C.

Initially, an aqueous solution of silica particles containing a fluorescent material (Lumogen Red 305) is manufactured by hydrolysis of tetraethyl orthosilicate (TEOS). Hereinafter, the silica particles containing the fluorescent material are referred to as fluorescent-substance-containing silica particles. At this time, a diameter $t_1$ of the fluorescent-substance-containing silica particles is set to $t_1$=150 nm.

Next, as illustrated in FIGS. 9A and 10A, fluorescent-substance-containing silica particles 31 are self-assembled into one layer on one surface of the glass substrate 30 according to a Langmuir-Blodgett (LB) method. At this time, one surface of the glass substrate 30 is surface-modified with (3-aminopropyl)triethoxysilane (APTES; terminal $NH_3^+$).

Next, as illustrated in FIGS. 9B and 10B, a metallic film 32 made of gold is formed on the self-assembled fluorescent-substance-containing silica particles 31 according to, for example, a vacuum evaporation method, and a laminated film 33 on which the metallic film 32 is laminated is formed on the fluorescent-substance-containing silica particles 31. At this time, the film thickness $t_2$ of the metallic film 32 is, for example, $t_2$=80 nm. Thereby, a film thickness of the laminated film 33, i.e., a height $t_3$ of the metallic structure 15 to be formed thereafter, is $t_3=t_1+t_2$=230 nm.

Next, as illustrated in FIGS. 9C and 10C, the laminated film 33 is patterned according to a focused ion beam method to form the metallic structures 15. At this time, the laminated film 33 is patterned as a periodic pattern so that a period Λ of the metallic structures 15 is 300 nm and widths W of the metallic structures 15 are 150 nm. The fluorescent-substance-containing silica particles 31 patterned together with the metallic structures 15 become the wavelength conversion units 14.

Through the above steps, the wavelength conversion substrate 7 of the present embodiment is completed.

Hereinafter, a second manufacturing method of the wavelength conversion substrate 7 having the above configuration will be described.

Figure 11A:
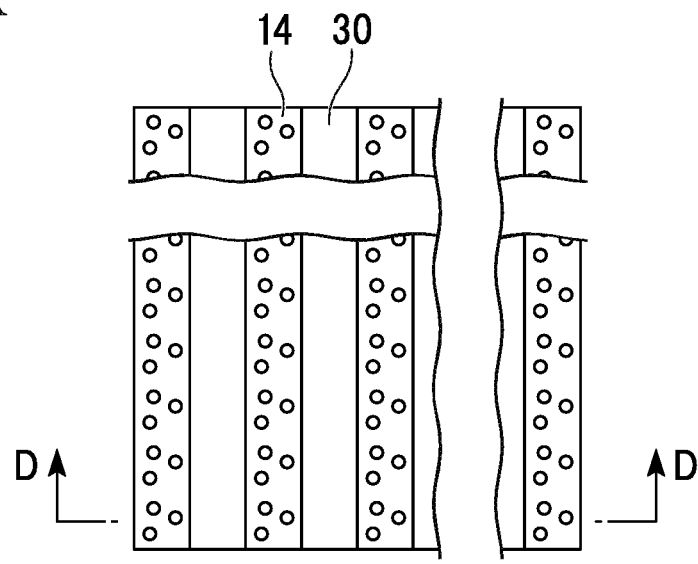
FIG. 11A is a first plan view illustrating a second manufacturing method of the wavelength conversion substrate according to the first embodiment in the order of steps.
Figure 11B:
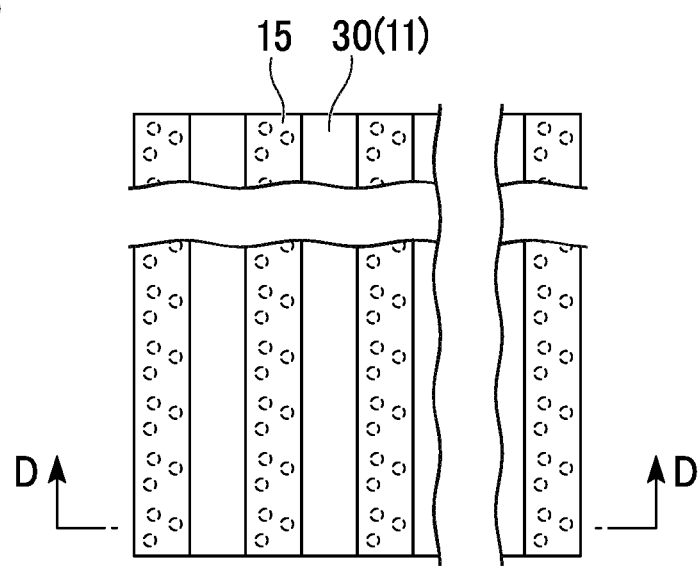
FIG. 11B is a second plan view illustrating the second manufacturing method of the wavelength conversion substrate according to the first embodiment in the order of steps.
Figure 12A:
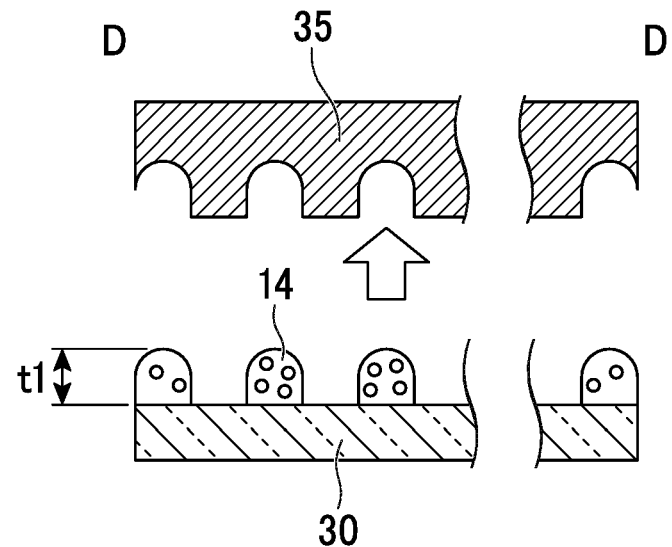
FIG. 12A is a cross-sectional view taken along the line D-D of FIG. 11A.
Figure 12B:
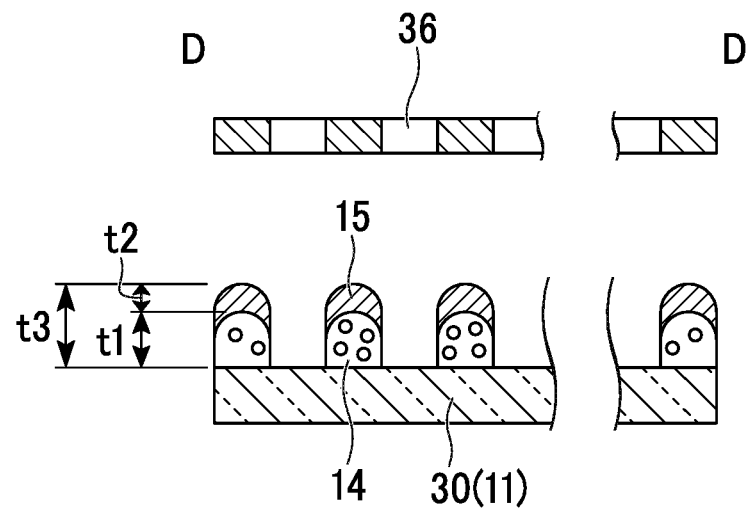
FIG. 12B is a cross-sectional view taken along the line D-D in FIG. 11B.

FIGS. 11A and 11B are plan views illustrating the second manufacturing method of the wavelength conversion substrate 7 according to the present embodiment in the order of steps. FIGS. 12A and 12B are cross-sectional views taken along the line D-D of FIGS. 11A and 11B.

Initially, a polydimethylsiloxane (PDMS) solution in which a fluorescent material (Lumogen Red 305) is dispersed is applied to one surface of the glass substrate 30 to form a PDMS film. At this time, the film thickness $t_1$ of the PDMS film is, for example, $t_1$=150 nm.

Next, as illustrated in FIGS. 11A and 12A, a concavo-convex shape of a master mold 35 is transferred to the PDMS film as a mold for forming the plurality of metallic structures 15 according to a hot press method and the PDMS film is patterned. The patterned PDMS film serves as the wavelength conversion units 14.

Next, as illustrated in FIGS. 11B and 12B, a metallic film made of gold is formed on the wavelength conversion units 14 according to, for example, a vacuum evaporation method via a pattern mask 36 and metallic structures 15 made of a metallic film laminated on the wavelength conversion units 14 are formed. At this time, the film thickness $t_2$ of the metallic film is, for example, $t_2$=80 nm. Thereby, the heights $t_3$ of the metallic structures 15 are $t_3=t_1+t_2$=230 nm.

Through the above steps, the wavelength conversion substrate 7 of the present embodiment is completed.

Hereinafter, a third manufacturing method of the wavelength conversion substrate 7 having the above configuration will be described.

Figure 13A:
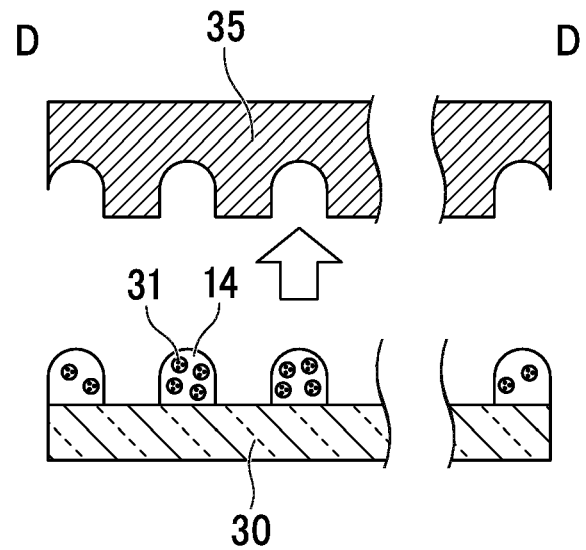
FIG. 13A is a first cross-sectional view illustrating a third manufacturing method of the wavelength conversion substrate according to the first embodiment in the order of steps.
Figure 13B:
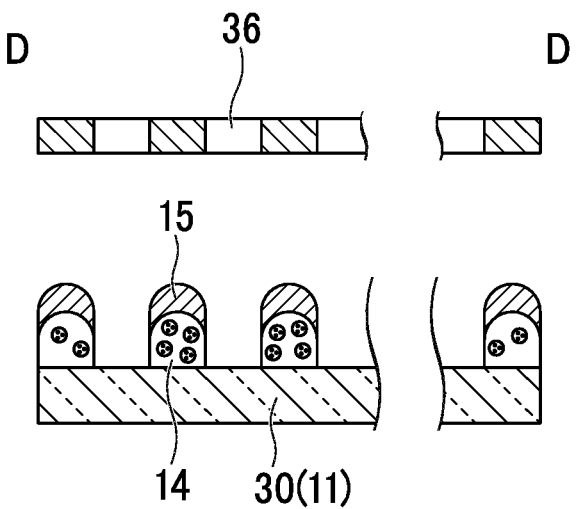
FIG. 13B is a second cross-sectional view illustrating the third manufacturing method of the wavelength conversion substrate according to the first embodiment in the order of steps.

FIGS. 13A and 13B are cross-sectional views illustrating the third manufacturing method of the wavelength conversion substrate 7 according to the present embodiment in order of steps.

The steps of the third manufacturing method are substantially the same as the steps of the second manufacturing method, but the third manufacturing method is different from the second manufacturing method in that fluorescent-substance-containing silica particles 31 similar to those used in the first manufacturing method are used.

Initially, a PDMS solution in which fluorescent-substance-containing silica particles 31 are dispersed is applied to one surface of the glass substrate to form a PDMS film.

At this time, although Lumogen Red 305 may be used as the fluorescent material, for example, Rh 101 can be used in place of Lumogen Red 305.

Next, as illustrated in FIG. 13A, a concavo-convex shape of a master mold 35 is transferred to the PDMS film as a mold for forming the plurality of metallic structures 15 according to a hot press method and the PDMS film is patterned. The patterned PDMS film serves as the wavelength conversion units 14.

Next, as illustrated in FIG. 13B, a metallic film made of gold is formed on the wavelength conversion units 14 according to, for example, a vacuum evaporation method via a pattern mask 36, and the metallic structures 15 made of the metallic film laminated on the wavelength conversion units 14 are formed.

Through the above steps, the wavelength conversion substrate 7 of the present embodiment is completed.

When the fluorescent-substance-containing silica particles 31 are used as in the first or third manufacturing method, there is an advantage in that light resistance and heat resistance of the fluorescent substance are improved because the periphery of the fluorescent material is covered with silica. Thus, even a dye having slightly weak light resistance or heat resistance such as a rhodamine dye or a fluorescein dye can be used as the wavelength converting material 16. Thereby, a degree of freedom of design for obtaining display with a desired color can be increased.

[Second Embodiment]

Hereinafter, a second embodiment of the present invention will be described with reference to FIGS. 14 and 15.

A basic configuration of the liquid-crystal display device of the present embodiment is the same as that of the first embodiment, and the structure of the electrode is different from that of the first embodiment.

FIG. 14 is a cross-sectional view of the liquid-crystal display device according to the second embodiment and is a view corresponding to FIG. 2 of the first embodiment. FIG. 15 is a plan view of the wavelength conversion substrate according to the second embodiment and is a view corresponding to FIG. 3 of the first embodiment.

Figure 15:
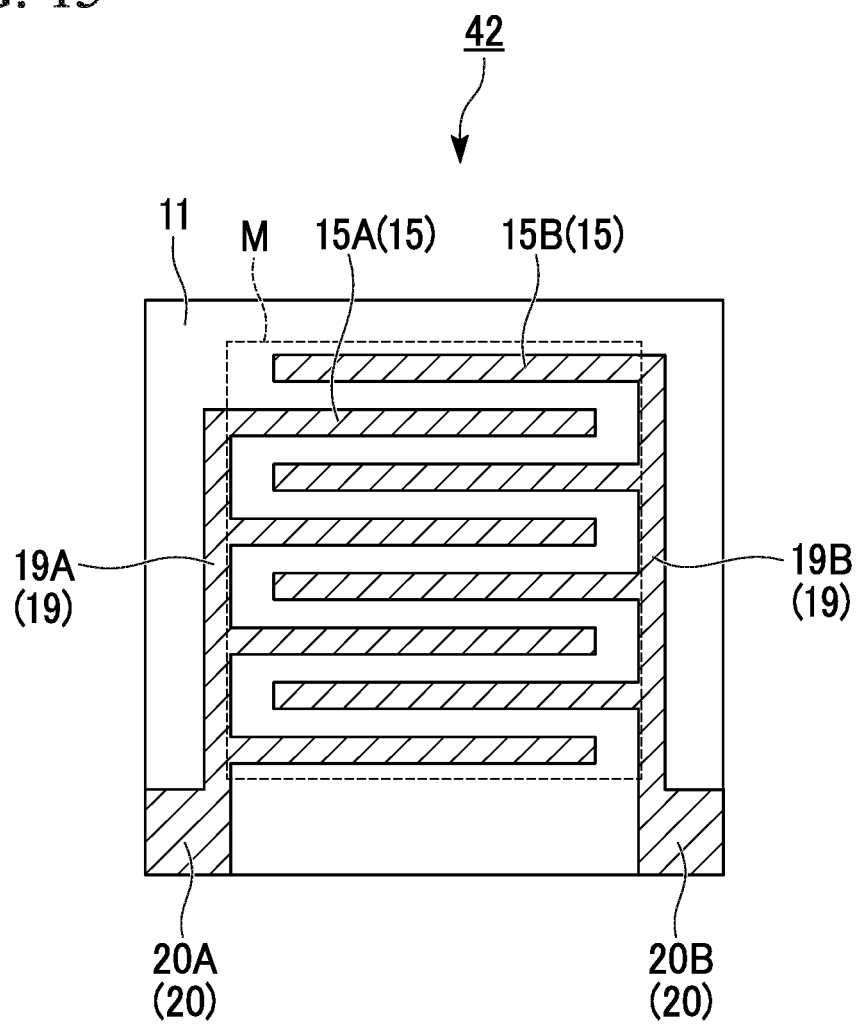
FIG. 15 is a plan view of a wavelength conversion substrate according to the second embodiment.

In FIGS. 14 and 15, the same reference numerals are given to constituent elements common to the drawings used in the first embodiment. Description thereof will be omitted.

In the liquid-crystal display device 1 of the first embodiment, the transparent electrode 23 is provided on the counter substrate 8, and the vertical electric field is generated in the liquid-crystal layer 9 when a voltage is applied between the transparent electrode 23 and the metallic structures 15. On the other hand, as illustrated in FIGS. 14 and 15, no transparent electrode is provided on a counter substrate 43 in a liquid-crystal display device 41 of the second embodiment. Every other one of a plurality of metallic structures 15 of the wavelength conversion substrate 42 are connected to either one of two coupling parts 19.

Hereinafter, a left connection part 19 of FIG. 15 is referred to as a first connection part 19A, a left electrode pad part 20 of FIG. 15 is referred to as a first electrode pad part 20A, and the metallic structures 15 connected to the first connection part 19A are referred to as first metallic structures 15A. On the other hand, a right connection part 19 of FIG. 15 is referred to as a second connection part 19B, a right electrode pad part 20 of FIG. 15 is referred to as a second electrode pad part 20B, and the metallic structures 15 connected to the second connection part 19B are referred to as second metallic structures 15B.

The plurality of metallic structures 15 are arranged so that an end parts opposite a side connected to the first connection part 19A of the first metallic structures 15A are engaged with end parts opposite a side connected to the second connection part 19B of the second metallic structures 15B.

In the second embodiment, a first potential is applied to the first electrode pad part 20A by the electric field generation unit 10, so that the plurality of first metallic structures 15A have the same first potential. Likewise, when a second potential is applied to the second electrode pad part 20B, the plurality of second metallic structures 15B have the same second potential. At this time, a horizontal electric field is generated in the liquid-crystal layer 9. That is, the plurality of first metallic structures 15A and the plurality of second metallic structures 15B function as a pair of electrodes for controlling the alignment state of the liquid-crystal molecules 9B, i.e., an electrode of so-called in-plane switching (IPS). Other configurations are similar to those of the first embodiment.

Also in the second embodiment, an advantageous effect similar to that of the first embodiment in which emitted light with a higher intensity than in the past can be obtained and a liquid-crystal display device with high energy efficiency can be implemented is obtained.

In the case of the first embodiment, when the vertical electric field is generated between the transparent electrode 23 and the metallic structures 15 as illustrated in FIG. 8B, the liquid-crystal molecules 9B are aligned substantially perpendicular to the substrate surface of the liquid-crystal element 4. Therefore, because an electric field vibration direction of light and a grating vector direction substantially coincide with each other with respect to light perpendicularly incident on the substrate surface of the liquid-crystal element 4 and plasmon resonance efficiently occurs, an intensity of emitted light is sufficiently increased. However, because the electric field vibration direction of light and the grating vector direction are deviated with respect to light obliquely incident on the substrate surface of the liquid-crystal element 4, plasmon resonance does not efficiently occur and it is difficult to sufficiently increase the intensity of obliquely emitted light.

On the other hand, in the case of the second embodiment, as illustrated in FIG. 14, when a horizontal electric field is generated between the first metallic structures 15A and the second metallic structures 15B, the liquid-crystal molecules 9B are aligned in a direction of the horizontal electric field between the first metallic structures 15A and the second metallic structures 15B. As described above, the liquid-crystal molecules 9B positioned on the side particularly close to the wavelength conversion substrate 42 in a thickness direction of the liquid-crystal layer 9 are aligned in various directions according to a positional relationship with the metallic structures 15. Here, focusing attention on the light L3 obliquely incident on the substrate surface of the liquid-crystal element 44, the electric field vibration direction and the grating vector direction are deviated immediately after the light L3 is transmitted through the counter substrate 43, but the above-described deviation is reduced according to the operation of the liquid-crystal molecules 9B at a point in time at which the light L3 proceeds through the liquid-crystal layer 9 and reaches the wavelength conversion substrate. Thereby, plasmon resonance efficiently occurs, and the intensity of obliquely emitted light can be sufficiently increased.

As described above, because an intensity of light obliquely transmitted through the liquid-crystal element 44 can also be increased in addition to light vertically transmitted through the liquid-crystal element 44 in the liquid-crystal display device 41 of the second embodiment, a characteristic of a wide angle of view can be obtained. Thereby, for example, the liquid-crystal display device 41 of the present embodiment can be used for a large-sized see-through display for public viewing applications or the like.

[Third Embodiment]

Hereinafter, a third embodiment of the present invention will be described with reference to FIG. 16.

A basic configuration of the liquid-crystal display device of the present embodiment is the same as that of the first embodiment, and a structure of an electrode is different from that of the first embodiment.

Figure 16:
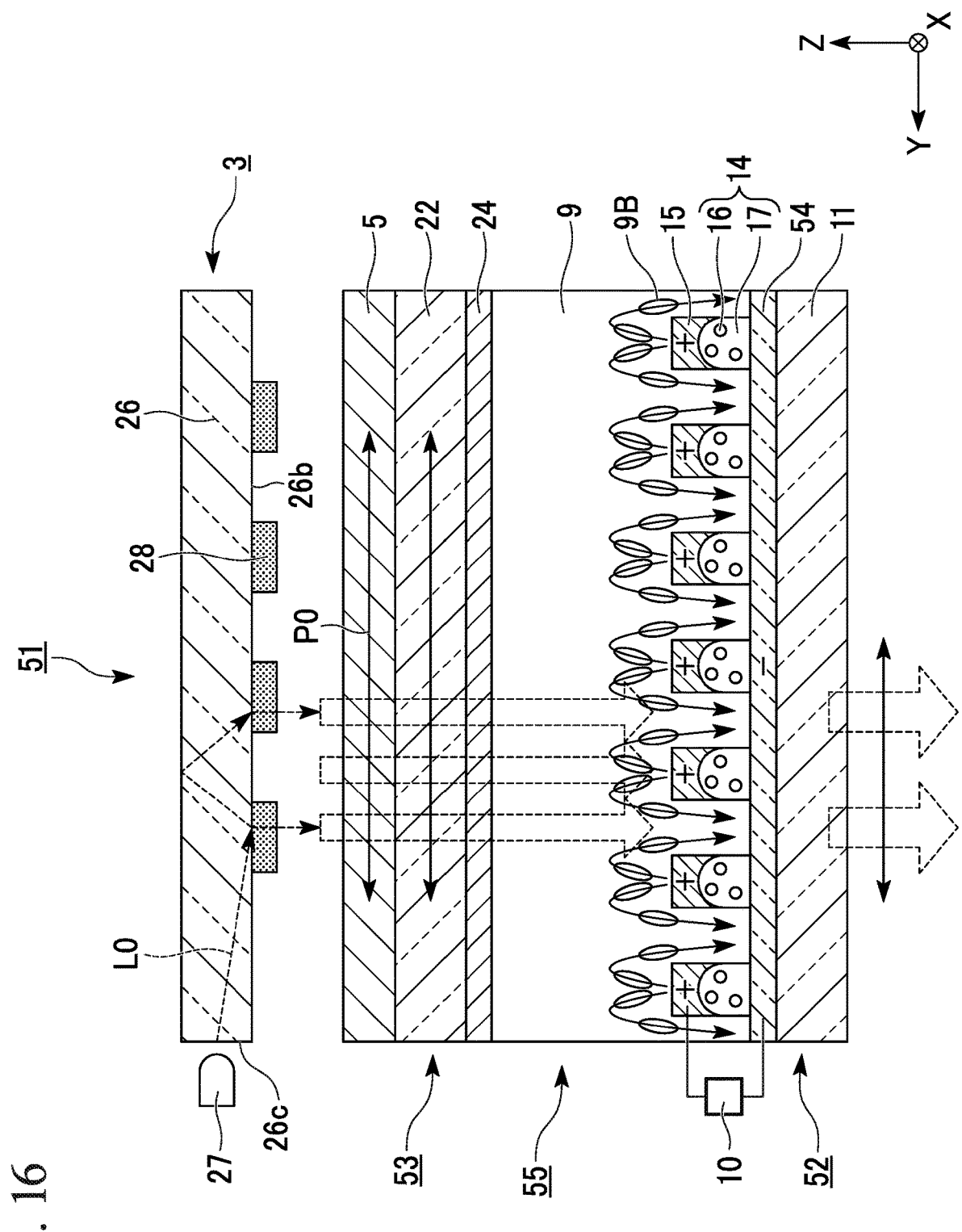
FIG. 16 is a cross-sectional view of a liquid-crystal display device of a third embodiment.

FIG. 16 is a cross-sectional view of the liquid-crystal display device of the third embodiment and is a view corresponding to FIG. 2 of the first embodiment.

In FIG. 16, the same reference numerals are given to constituent elements common to the drawings used in the first embodiment. Description thereof will be omitted.

As illustrated in FIG. 16, a liquid-crystal display device 51 of the third embodiment does not include a transparent electrode on a counter substrate 53, but includes a transparent electrode 54 between wavelength conversion units 14 and a first substrate 11 in a wavelength conversion substrate 52. The transparent electrode 54 is provided on the entire surface of the first substrate 11. The transparent electrode 54 preferably includes a transparent conductive material having high optical transparency such as ITO or IZO. In the third embodiment, IZO having a film thickness of 100 nm is used as the transparent electrode 54.

In a liquid-crystal element 55 of the third embodiment, a first potential is supplied to a plurality of metallic structures 15 by an electric field generation unit 10, and a second potential is supplied to the transparent electrodes 54, so that a horizontal electric field is generated in a liquid-crystal layer 9. That is, the plurality of metallic structures 15 and the transparent electrode 54 function as a pair of electrodes for controlling an alignment state of liquid-crystal molecules 9B, i.e., electrodes of a so-called fringe-field switching (FFS) system. Other configurations are similar to those of the first embodiment.

Also in the third embodiment, an advantageous effect similar to that of the first embodiment in which emitted light with a higher intensity than in the past can be obtained and a liquid-crystal display device with high energy efficiency can be implemented is obtained.

In the case of the liquid-crystal display device 41 of the second embodiment, liquid-crystal molecules 9B between the first metallic structures 15A and the second metallic structures 15B are aligned in an electric field direction in the electric field ON state as illustrated in FIG. 14. However, because substantially no electric field is formed in a region immediately above the metallic structures 15, the liquid-crystal molecules 9B in this region hardly move from the electric field OFF state. As a result, only a part of light incident on the liquid-crystal layer 9 contributes to plasmon resonance, and it is difficult to sufficiently increase an intensity of emitted light.

On the other hand, in the liquid-crystal display device 51 of the third embodiment, because the horizontal electric field of the FFS system is used as illustrated in FIG. 16, the liquid-crystal molecules 9B in the region immediately above the metallic structures 15 as well as the liquid-crystal molecules 9B between two adjacent metallic structures 15 are aligned in the electric field direction. As a result, most of the light incident on the liquid-crystal layer 9 can contribute to the plasmon resonance and an intensity of emitted light can be sufficiently increased.

[Fourth Embodiment]

Hereinafter, a fourth embodiment of the present invention will be described with reference to FIG. 17.

A basic configuration of the liquid-crystal display device of the present embodiment is the same as that of the first embodiment and a configuration of the counter substrate side is different from that of the first embodiment.

Figure 17:
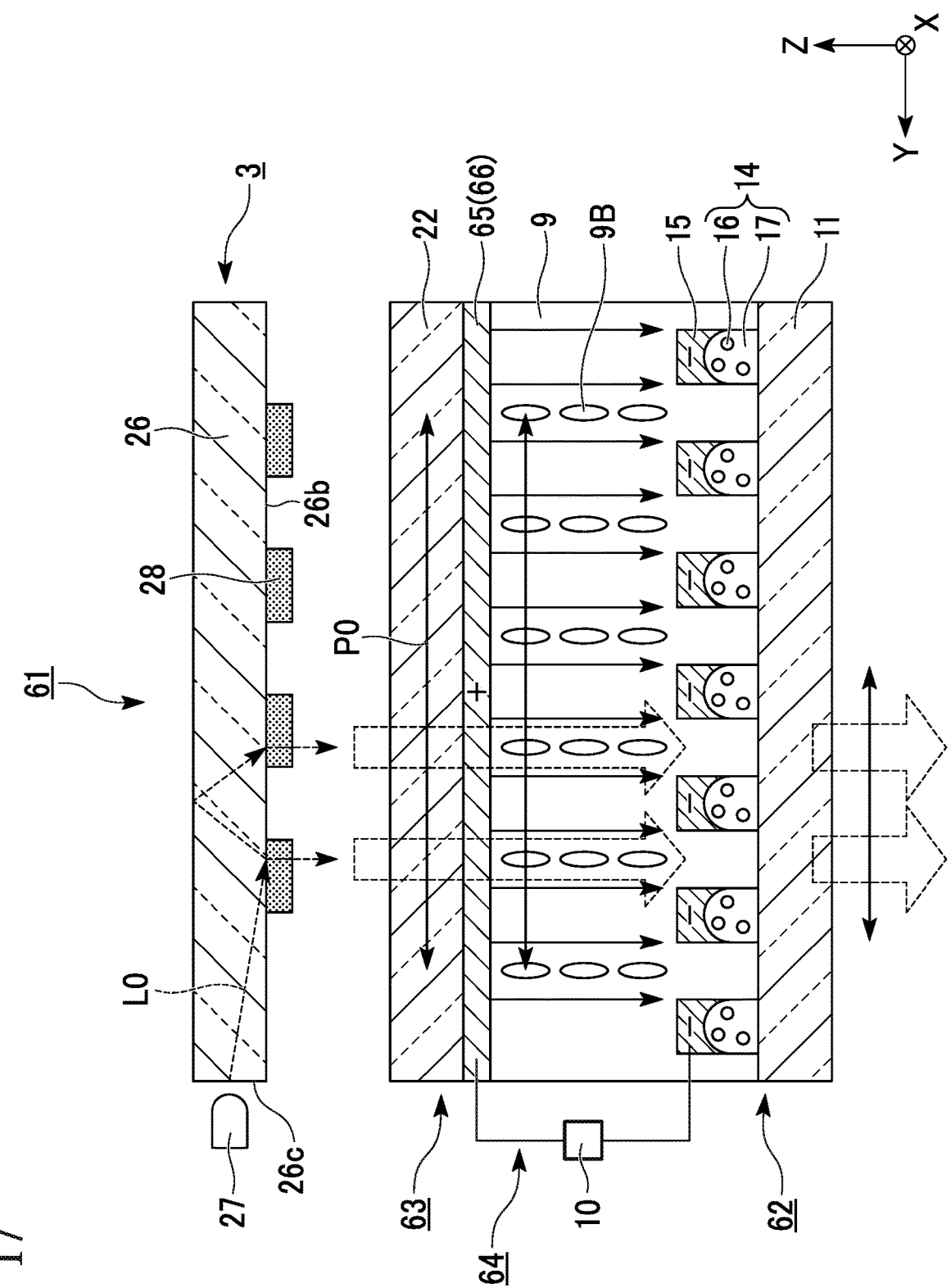
FIG. 17 is a cross-sectional view of a liquid-crystal display device according to a fourth embodiment.

FIG. 17 is a cross-sectional view of the liquid-crystal display device according to the fourth embodiment and is a view corresponding to FIG. 2 of the first embodiment.

In FIG. 17, the same reference numerals are given to constituent elements common to the drawings used in the first embodiment. Description thereof will be omitted.

As illustrated in FIG. 17, in a liquid-crystal display device 61 of the fourth embodiment, no polarizer is provided between a light source 3 and a liquid-crystal element 64. Also, a transparent electrode and an alignment film are not provided on a second substrate 22 constituting a counter substrate 63. A metallic electrode 65 is provided on one surface of the second substrate 22. Although not illustrated in FIG. 17, a metallic electrode 65 includes a plurality of electrode parts 66 extending in a direction (a Y direction) perpendicular to an extending direction of metallic structures 15 of a wavelength conversion substrate 62 side, and the plurality of electrode parts 66 are provided parallel to one another with spaces therebetween. That is, the plurality of electrode parts 66 of the metallic electrode 65 and the plurality of metallic structures 15 are orthogonal to one another when viewed from a normal direction of the second substrate 22.

A period and widths of the electrode parts 66 may be substantially equal to a period and widths of the metallic structures 15. Therefore, the period of the electrode parts 66 is, for example, about 300 nm, and the widths of the electrode parts 66 are, for example, about 150 nm. Because the plurality of electrode parts 66 extending in one direction are provided parallel to one another with spaces therebetween, the metallic electrode 65 also functions as an alignment film on a counter substrate 63 side. Thereby, in a configuration in which no alignment film is provided on the counter substrate 63 side, it is also possible to implement a TN type liquid-crystal layer 9 by aligning the liquid-crystal molecules 9B in a predetermined direction.

Also in the fourth embodiment, an advantageous effect similar to that of the first embodiment in which emitted light with a higher intensity than in the past can be obtained and a liquid-crystal display device with high energy efficiency can be implemented is obtained.

Particularly, in the case of the fourth embodiment, an intensity of light transmitted through the liquid-crystal layer 9 can be increased as compared with the first embodiment. The reason is as follows.

Because the liquid-crystal display device 1 of the first embodiment includes a polarizer 5 and the transmittance of a general polarizer is about 40%, 40% of the light emitted from the light source 3 is incident on the liquid-crystal layer 9.

On the other hand, the liquid-crystal display device 61 of the fourth embodiment does not include the polarizer 5, and the transmittance of the metallic electrode 65 is determined by a ratio of widths and intervals of the electrode parts 66. For example, if the ratio of the widths and the intervals of the electrode parts 66 is set to 1:1, 50% of light can be made incident on the liquid-crystal layer 9. As described above, in the liquid-crystal display device 61 of the fourth embodiment, an amount of light incident on the liquid-crystal layer 9 can be increased as compared with the liquid-crystal display device 1 of the first embodiment. Thereby, it is possible to increase both light other than that of a plasmon resonance wavelength band and light emitted from a wavelength converting material and it is possible to obtain emitted light with a higher intensity.

[Fifth Embodiment]

Hereinafter, a fifth embodiment of the present invention will be described with reference to FIGS. 18 to 23.

A basic configuration of the liquid-crystal display device of the present embodiment is the same as that of the first embodiment, and is an example of a see-through display in which color display is possible using the liquid-crystal display device of the first embodiment.

Figure 18:
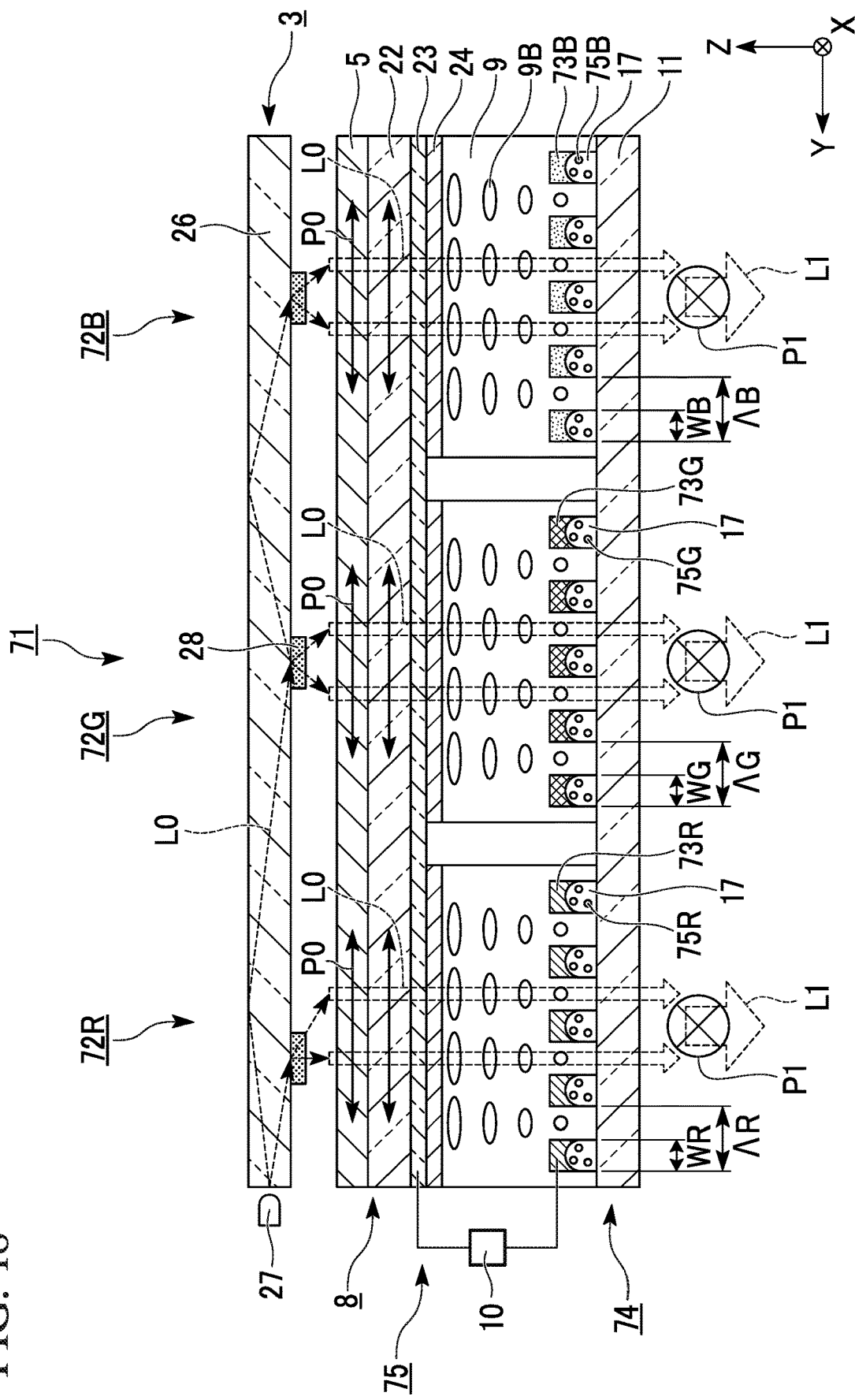
FIG. 18 is a cross-sectional view of a liquid-crystal display device according to a fifth embodiment.

FIG. 18 is a cross-sectional view of the liquid-crystal display device of the fifth embodiment and is a view corresponding to FIG. 2 of the first embodiment.

In FIGS. 18 to 23, the same reference numerals are given to constituent elements common to the drawings used in the first embodiment. Description thereof will be omitted.

As illustrated in FIG. 18, a liquid-crystal display device 71 of the fifth embodiment includes a red sub-pixel 72R, a green sub-pixel 72G, and a blue sub-pixel 72B. One pixel includes a red sub-pixel 72R, a green sub-pixel 72G, and a blue sub-pixel 72B which are adjacent. Furthermore, a display image is formed by arranging a plurality of pixels in a matrix shape. A basic configuration of the liquid-crystal display device is common to all three types of sub-pixels 72R, 72G, and 72B. A configuration of a counter substrate 8 is the same as that of the first embodiment.

In the fifth embodiment, a configuration of the wavelength conversion substrate 74 is different from that of the first embodiment. Specifically, types and dimensions of a fluorescent material and metallic structures constituting a light modulation unit differ according to each sub-pixel.

In the red sub-pixel 72R, the type of the metallic structures 73R is, for example, gold. A period ΛR of the metallic structures 73R is, for example, 300 nm. Widths WR of the metallic structures 73R are, for example, 150 nm. As the wavelength converting material 75R, for example, Lumogen Red 305 which is one type of red fluorescent substance is used as in the first embodiment.

In the green sub-pixel 72G, a type of the metallic structures 73G is, for example, silver. A period ΛG of the metallic structures 73G is, for example, 450 nm. Widths WG of the metallic structures 73G are, for example, 225 nm. As the wavelength converting material 75G, for example, Coumarin 6 which is one type of green fluorescent substance is used.

Figure 22:
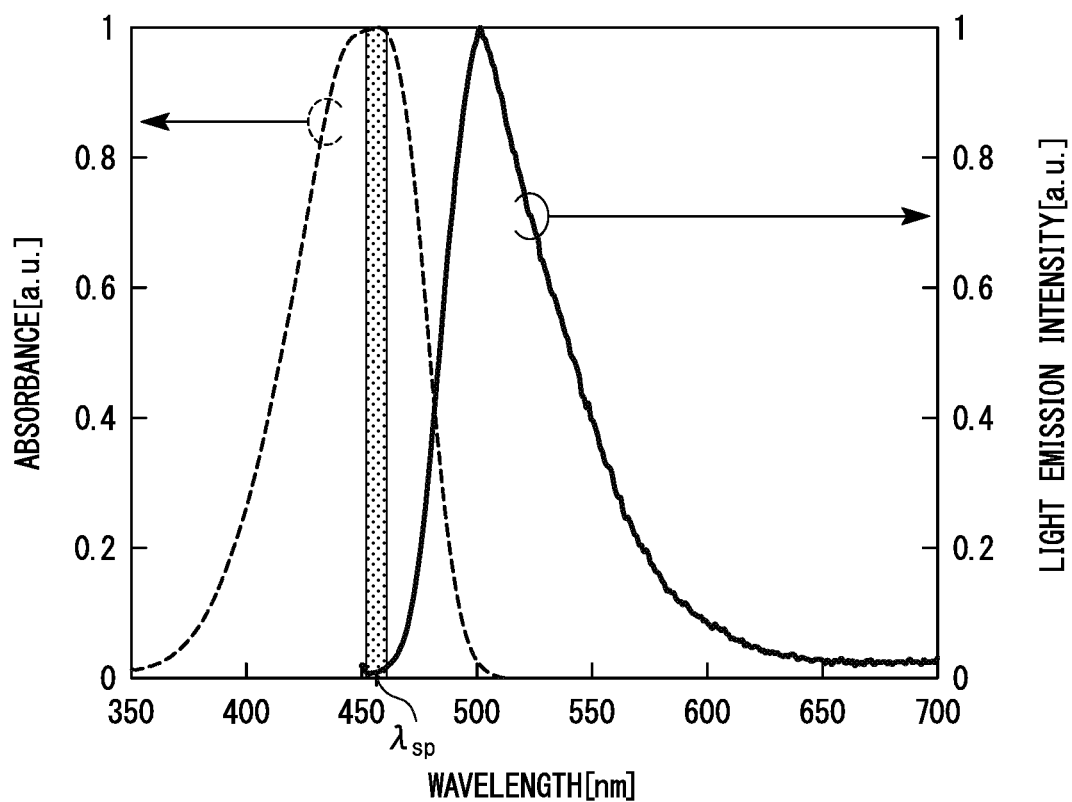
FIG. 22 is a diagram illustrating an absorption spectrum and an emission spectrum of a green fluorescent substance used in a liquid-crystal display device.

FIG. 22 illustrates an absorption spectrum and an emission spectrum of Coumarin 6. In FIG. 22, the horizontal axis represents a wavelength [nm], the left vertical axis represents absorbance [a. u.], and the right vertical axis represents a light emission intensity [a. u.]. A graph of a broken line indicates an absorption spectrum, and a graph of a solid line indicates an emission spectrum.

An absorption spectrum of Coumarin 6 has an absorption wavelength band in a range of about 350 nm to 500 nm and a peak with a wavelength of about 460 nm as an absorption maximum wavelength. An emission spectrum of Coumarin 6 has an emission wavelength band in the range of about 450 nm to 700 nm and a peak with a wavelength of about 500 nm as an emission maximum wavelength. Here, in the case of the fifth embodiment, a plasmon resonance wavelength $\lambda_{sp}$ obtained from Equation (1) is about 460 nm. As illustrated in FIG. 22, a plasmon resonance wavelength $\lambda_{sp}$ of 460 nm is within the absorption wavelength band of the absorption spectrum of Coumarin 6.

In a blue sub-pixel 72B, a type of the metallic structures 73B is, for example, aluminum. A period ΛB of the metallic structures 73B is, for example, 500 nm. Widths WB of the metallic structures 73B are, for example, 250 nm. As the wavelength converting material 75B, for example, Perylene which is one type of blue fluorescent substance is used.

Figure 23:
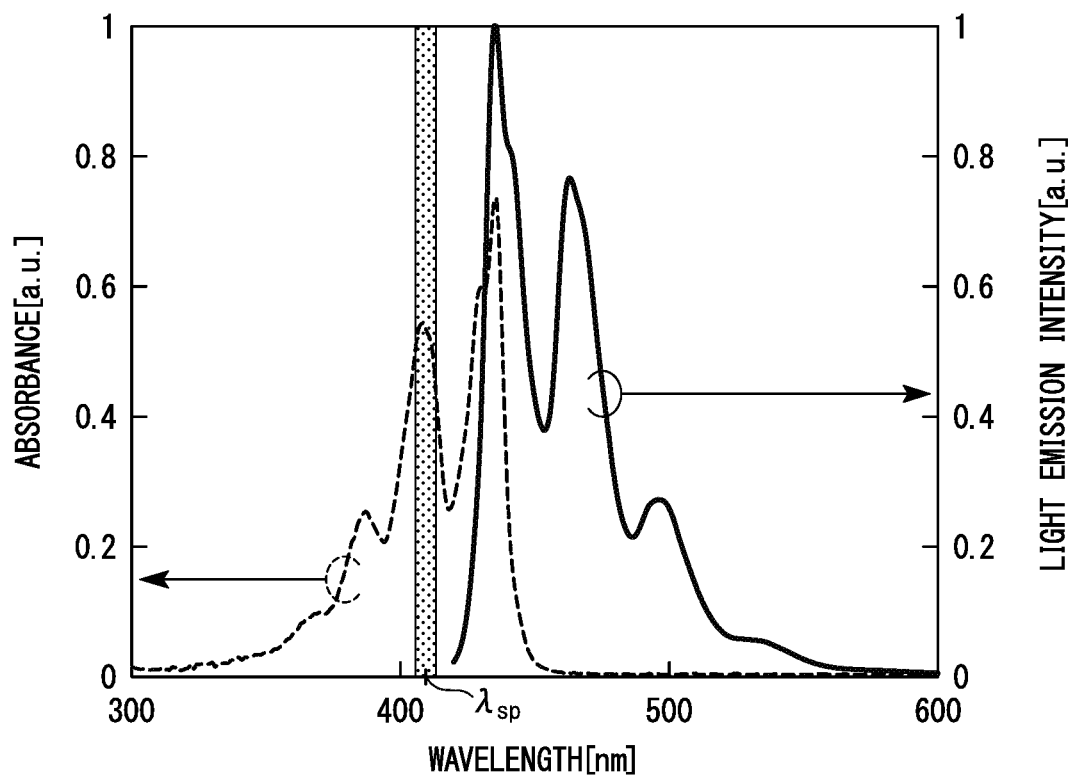
FIG. 23 is a diagram illustrating an absorption spectrum and an emission spectrum of a blue fluorescent substance used in the liquid-crystal display device.

FIG. 23 is a view illustrating an absorption spectrum and an emission spectrum of Perylene. In FIG. 23, the horizontal axis represents a wavelength [nm], the left vertical axis represents absorbance [a. u.], and the right vertical axis represents a light emission intensity [a. u.]. A graph of a broken line indicates an absorption spectrum, and a graph of a solid line indicates an emission spectrum.

An absorption spectrum of Perylene has an absorption wavelength band in a range of about 300 nm to 450 nm and a peak with a wavelength of about 430 nm as an absorption maximum wavelength. An emission spectrum of Perylene has an emission wavelength band in a range of about 420 nm to 600 nm and a peak with a wavelength of about 435 nm as an emission maximum wavelength. Here, in the case of the present embodiment, the plasmon resonance wavelength $\lambda_{sp}$ obtained from Equation (1) is about 410 nm. As illustrated in FIG. 23, the plasmon resonance wavelength $\lambda_{sp}$ of 410 nm is within the absorption wavelength band of the absorption spectrum of Perylene.

Switching of display for each sub-pixel in the fifth embodiment will be described.

Figure 19:
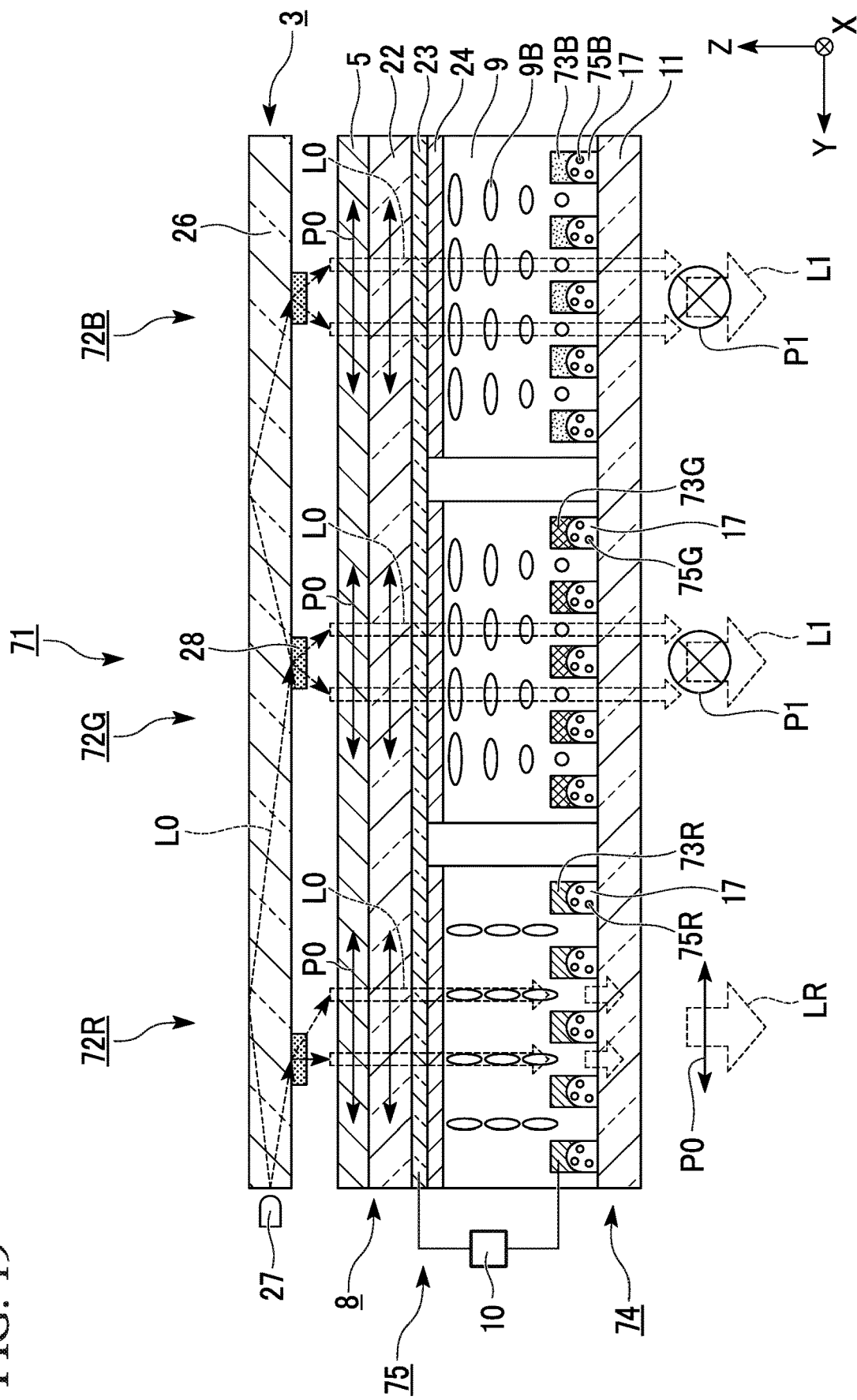
FIG. 19 is a diagram illustrating an operation when a red sub-pixel is in an electric field ON state.
Figure 20:
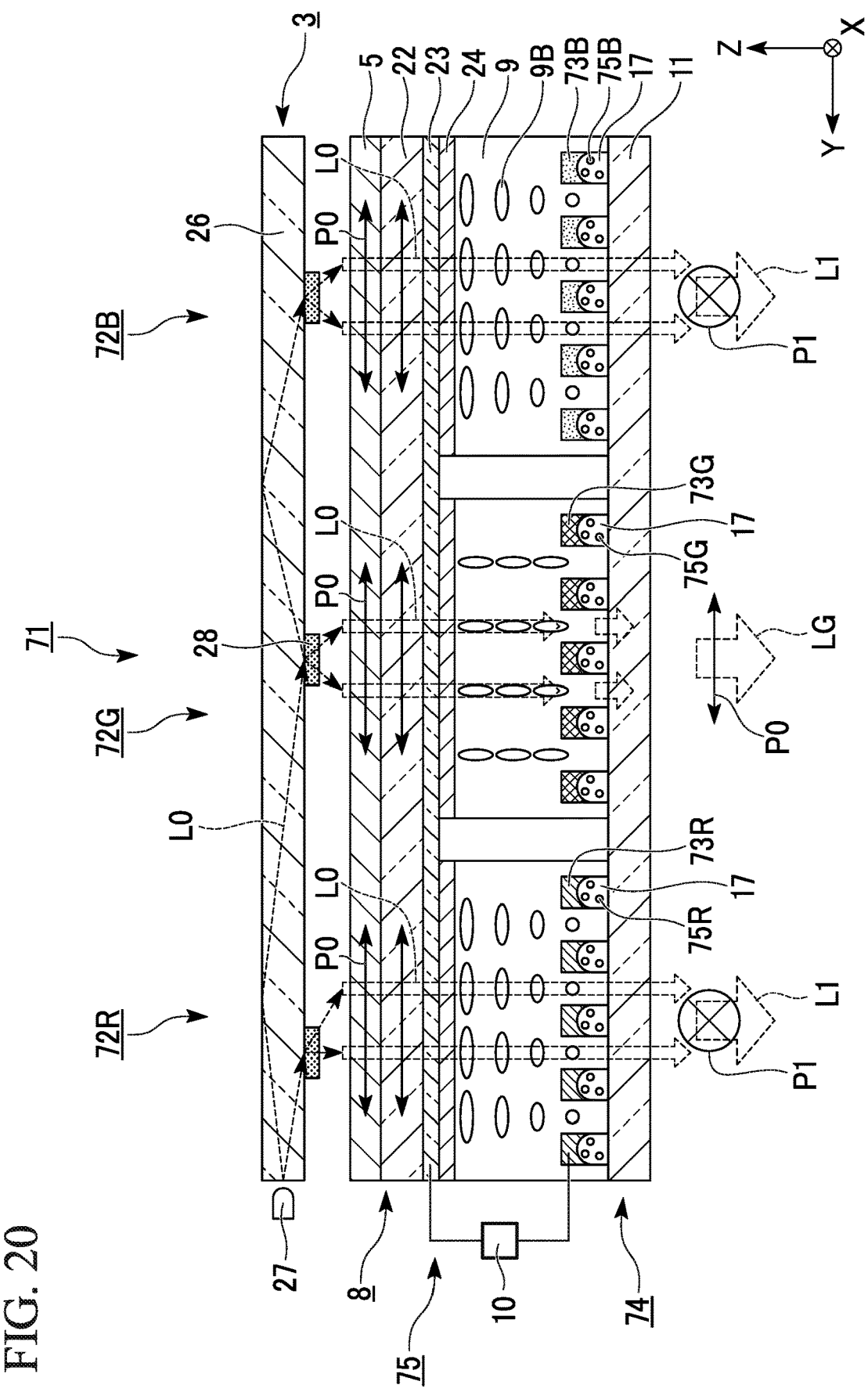
FIG. 20 is a view illustrating an operation when a green sub-pixel is in an electric field ON state.
Figure 21:
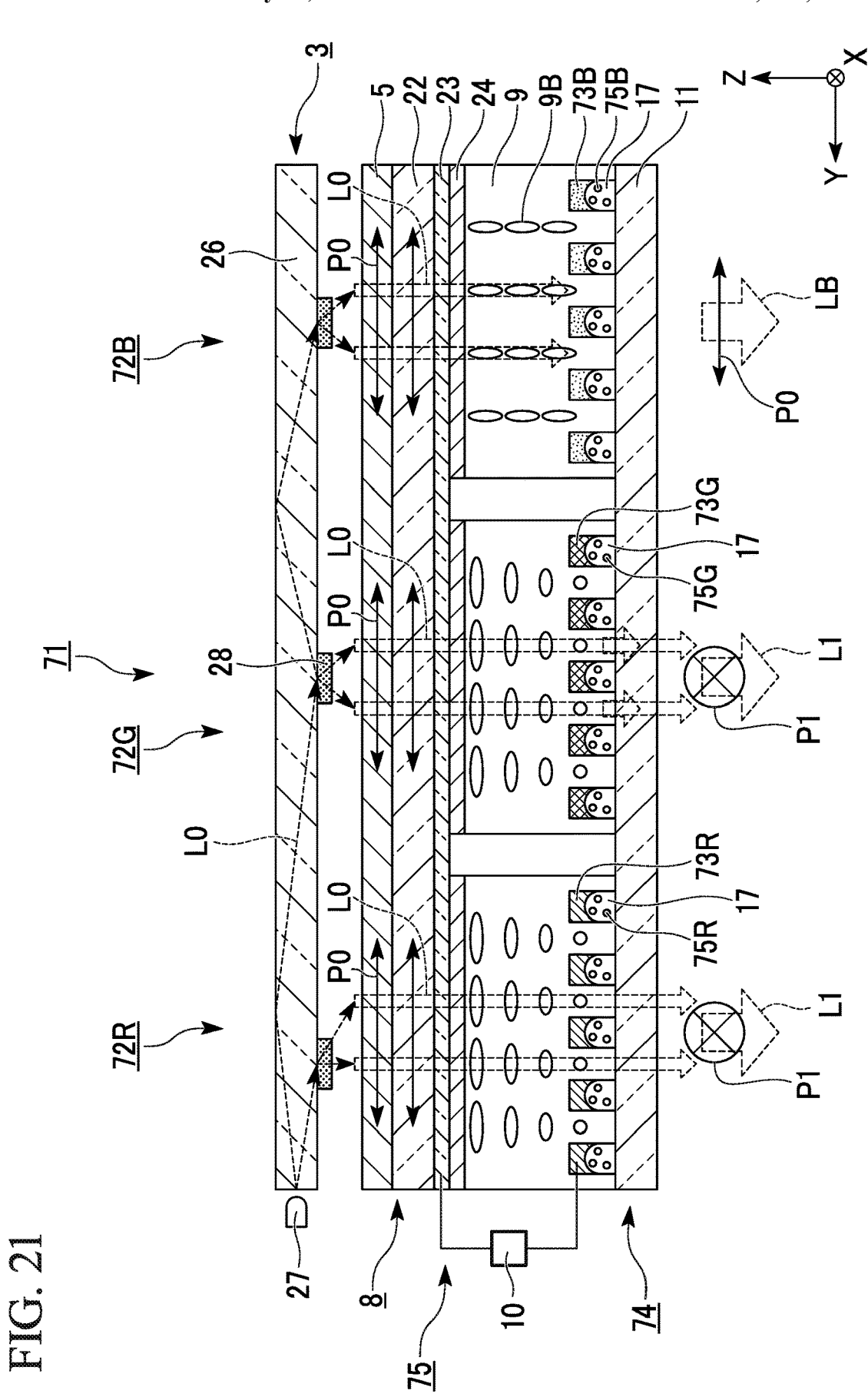
FIG. 21 is a diagram illustrating an operation when a blue sub-pixel is in an electric field ON state.

FIG. 18 is a diagram illustrating an operation when all the sub-pixels 72R, 72G, and 72B are in an electric field OFF state. FIG. 19 is a diagram illustrating an operation when only the red sub-pixel 72R is in an electric field ON state. FIG. 20 is a diagram illustrating the operation when only the green sub-pixel 72G is in an electric field ON state. FIG. 21 is a diagram illustrating an operation when only the blue sub-pixel 72B is in an electric field ON state.

Also, although the electric field generation unit 10 is illustrated as being connected only to the red sub-pixel 72R in FIGS. 18 to 21, different electric fields are independently generated for the sub-pixels 72R, 72G, and 72B in reality.

When all the sub-pixels 72R, 72G, and 72B are in an electric field OFF state as illustrated in FIG. 18, the liquid-crystal molecules 9B are twisted by 90° and aligned between the wavelength conversion substrate 74 and the counter substrate 8. Thus, light L0 having the polarization direction P0 parallel to the sheet surface of FIG. 18 within light emitted from the light source 3 is transmitted through the counter substrate 8 after being transmitted through the polarizer 5 and becomes light L1 having the polarization direction P1 perpendicular to the sheet surface when the light L0 reaches the metallic structures 73R, 73G, and 73B through the liquid-crystal layer 9. Because the light L1 is transmitted through the metallic structures 73R, 73G, and 73B regardless of a wavelength (a full transmission state), the white light L1 is emitted from a liquid-crystal element 75.

Next, as illustrated in FIG. 19, when the red sub-pixel 72R is in an electric field ON state, the liquid-crystal molecules 9B of the red sub-pixel 72R are substantially vertically aligned toward a substrate surface between the wavelength conversion substrate 74 and the counter substrate 8. Thus, even when the light L0 having the polarization direction P0 parallel to the sheet surface of FIG. 19 reaches the metallic structure 73R through the liquid-crystal layer 9, a polarization direction of the light remains parallel to the sheet surface. Therefore, the light L0 contributes to the plasmon resonance, and light of a wavelength band other than that of a plasmon resonance wavelength and light emitted from the wavelength converting material (Lumogen Red 305) due to the enhanced electric field of the plasmon resonance are summed and consequently light LR having a high intensity of a red region is emitted. White light L1 is emitted from the green sub-pixel 72G and the blue sub-pixel 72B.

Also, when the green sub-pixel 72G is in an electric field ON state as illustrated in FIG. 20, like when the red sub-pixel 72R is in an electric field ON state, light of a wavelength band other than that of the plasmon resonance wavelength and light emitted from the wavelength converting material (Coumarin 6) due to the enhanced electric field of the plasmon resonance are summed and consequently light LG with a high intensity in the green region is emitted. White light L1 is emitted from the red sub-pixel 72R and the blue sub-pixel 72B.

Also, when the blue sub-pixel 72B is in an electric field ON state as illustrated in FIG. 21, like when the red sub-pixel 72R is in an electric field ON state, light of a wavelength band other than that of the plasmon resonance wavelength and light emitted from the wavelength converting material (Perylene) due to the enhanced electric field of the plasmon resonance are summed and consequently light LB having a high intensity in the blue region is emitted. White light L1 is emitted from the red sub-pixel 72R and the green sub-pixel 72G.

Also in the fifth embodiment, an advantageous effect similar to that of the first embodiment in which emitted light with a higher intensity than in the past can be obtained and a liquid-crystal display device with high energy efficiency can be implemented is obtained.

In particular, in the fifth embodiment, as described above, it is possible to emit light of a color corresponding to the sub-pixel from each of the sub-pixels 72R, 72G, and 72B. Thereby, an embodiment of the present invention can be applied to a see-through display capable of displaying color. Also, because a different material of the metallic structure is used according to the sub-pixels 72R, 72G, 72B, a degree of freedom of selection of various parameters for exhibiting plasmon resonance can be increased.

[Sixth Embodiment]

Hereinafter, a sixth embodiment of the present invention will be described with reference to FIG. 24.

A basic configuration of a liquid-crystal display device of the present embodiment is the same as that of the fifth embodiment, and a configuration of a wavelength conversion unit is different from that of the fifth embodiment.

Figure 24:
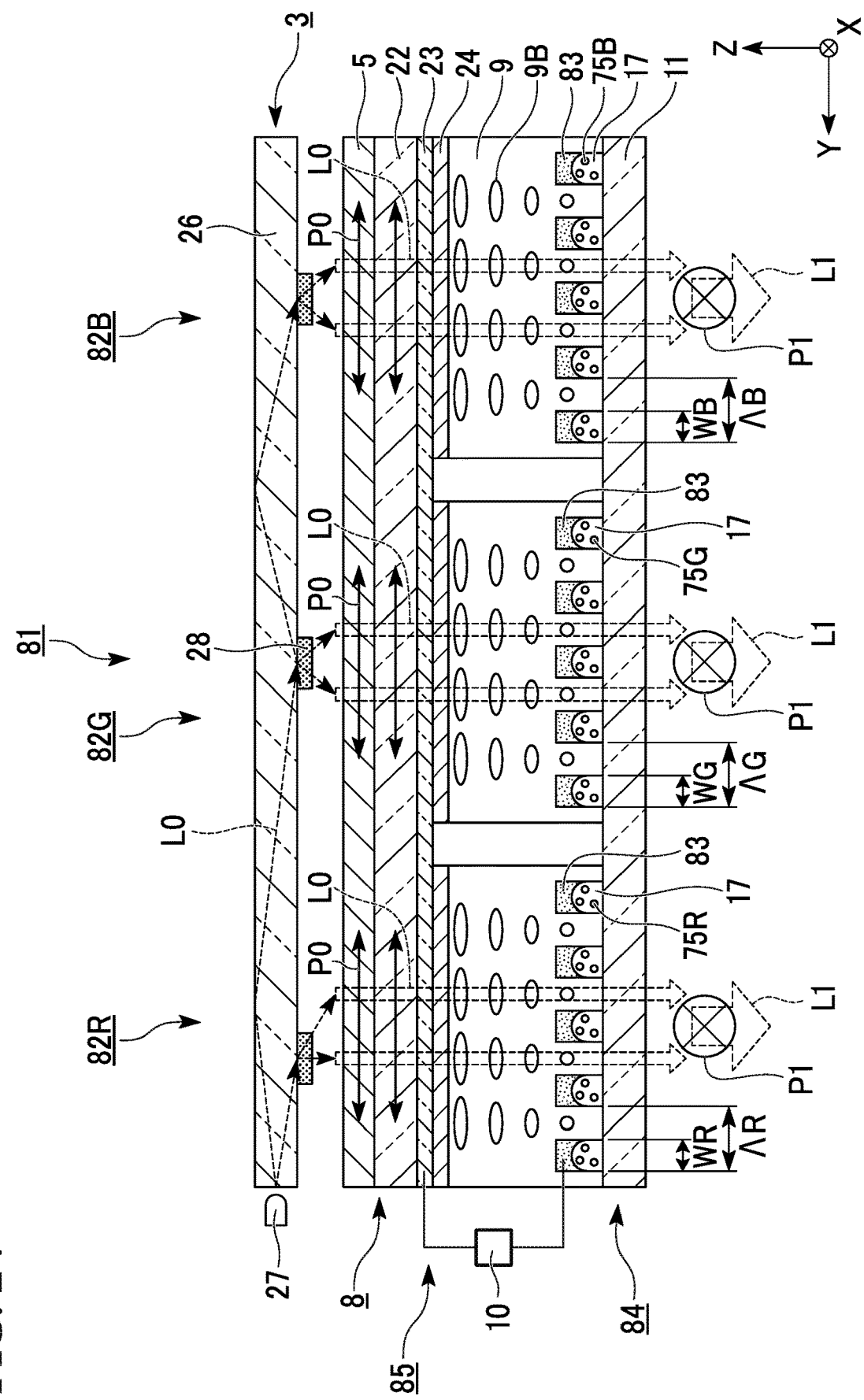
FIG. 24 is a cross-sectional view of a liquid-crystal display device according to a sixth embodiment.

FIG. 24 is a cross-sectional view of the liquid-crystal display device according to the sixth embodiment.

In FIG. 24, the same reference numerals are given to constituent elements common to the drawings used in the first embodiment. Description thereof will be omitted.

The materials of the metallic structures 73R, 73G, and 73B differ according to each of the sub-pixels 72R, 72G, and 72B in the liquid-crystal display device 71 according to the fifth embodiment, whereas a common metallic material is used as a material of metallic structures 83 across all sub-pixels 82R, 82G, and 82B in a liquid-crystal display device 81 according to the sixth embodiment. Specifically, aluminum is used as the material of the metallic structures 83. Alternatively, indium may be used as the material of the metallic structures 83. Alternatively, rhodium may be used as the material of the metallic structures 83. Alternatively, ruthenium may be used as the material of the metallic structures 83. Therefore, in the sixth embodiment, the configuration of a wavelength conversion substrate 84 of a liquid-crystal element 85 is different from that in the fifth embodiment, and other configurations are the same as in the fifth embodiment.

Other configurations of the wavelength conversion unit are as follows.

In the red sub-pixel 82R, a period ΛR of the metallic structures 83 is, for example, 500 nm<ΛR<650 nm. Widths WR of the metallic structures 83 are ½ of the period ΛR. As the wavelength converting material 75R, for example, Lumogen Red 305 which is one type of red fluorescent substance is used.

In the green sub-pixel 82G, a period ΛG of the metallic structures 83 is, for example, 400 nm<ΛG<550 nm. Widths WG of the metallic structures 83 are ½ of the period ΛG. As the wavelength converting material 75G, for example, Coumarin 6 which is one type of green fluorescent substance is used.

In the blue sub-pixel 82B, a period ΛB of the metallic structures 83 is, for example, 200 nm<ΛB<350 nm. Widths WB of the metallic structures 83 are ½ of the period ΛB. As the wavelength converting material 75B, for example, Perylene which is one type of blue fluorescent substance is used.

In the case of the sixth embodiment, a plasmon resonance wavelength $\lambda_{sp}$ is about 565 nm in the red sub-pixel 82R, about 460 nm in the green sub-pixel 82G and about 410 nm in the blue sub-pixel 82B.

Also in the sixth embodiment, an advantageous effect similar to that of the first embodiment in which emitted light with a higher intensity than in the past can be obtained and a liquid-crystal display device with high energy efficiency can be implemented is obtained.

In particular, in the sixth embodiment, because the material of the metallic structure 83 is common to all the sub-pixels 82R, 82G, and 82B, when the metallic structure 83 is formed by using a mask deposition method, a deposition process is performed once. Thereby, the manufacturing process of the wavelength conversion substrate 84 is simplified.

Also, because aluminum used as the material of the metallic structure 83 is cheaper than gold or silver, manufacturing cost can be reduced. Furthermore, because aluminum has a small internal loss and an electric field intensity thereof during plasmon resonance is greater than that of gold or silver, a high light emission intensity can be expected.

Also, a technical scope of the present invention is not limited to the above embodiments and various modifications can be made without departing from the subject matter of the present invention.

For example, although an example of a wavelength conversion units having hemispherical shapes is given in the above embodiment, the shapes of the wavelength conversion units are not limited thereto and wavelength conversion units having shapes shown below may be used.

Figure 25:
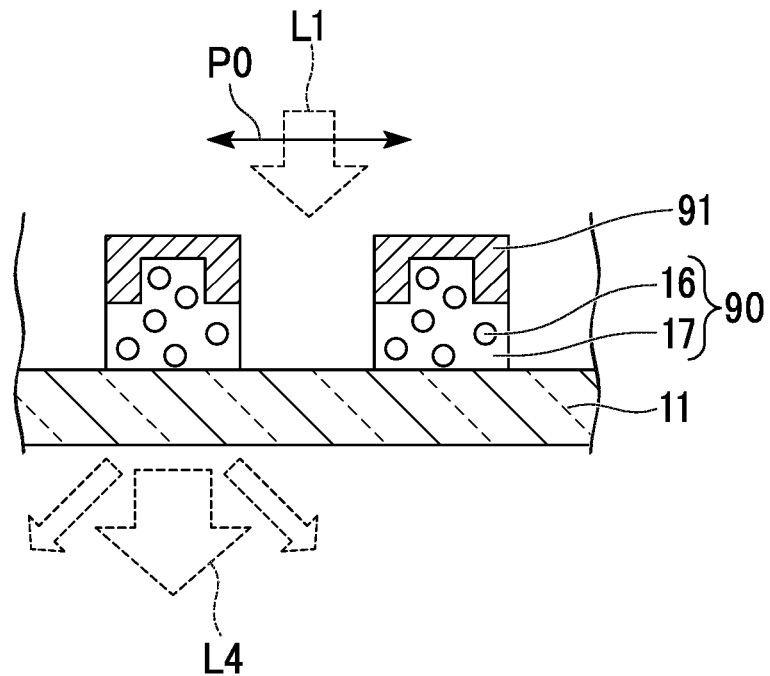
FIG. 25 is a cross-sectional view illustrating a first modified example of the wavelength conversion unit.

FIG. 25 is a cross-sectional view illustrating a first modified example of the wavelength conversion units.

As illustrated in FIG. 25, wavelength conversion units 90 of the first modified example have convex shapes toward metallic structures 91, and have rectangular convex shapes in surfaces (upper surfaces) of a side in contact with the metallic structures 91. In the case of the wavelength conversion units 90 of the first modified example, because light traveling toward the metallic structures 91 is reflected by surfaces of the concave metallic structures 91 including flat surfaces, much light L4 is emitted in a direction substantially parallel to a normal line of a substrate surface from the first substrate 11. Thus, in the wavelength conversion units 90, directivity of the emitted light can be increased as compared with the wavelength conversion units of the above embodiment.

Figure 26:
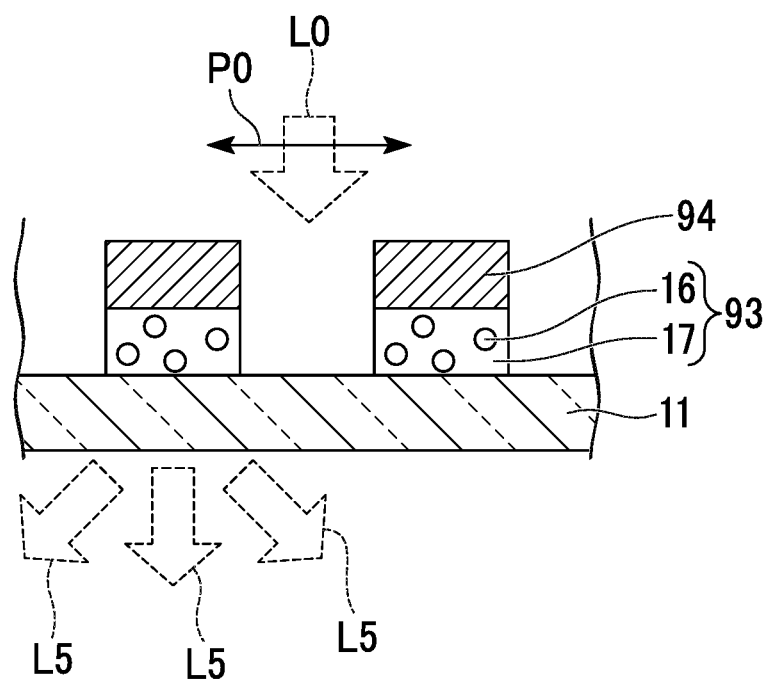
FIG. 26 is a cross-sectional view illustrating a second modified example of the wavelength conversion unit.

FIG. 26 is a cross-sectional view illustrating a second modified example of the wavelength conversion units.

As illustrated in FIG. 26, in wavelength conversion units 93 of the second modified example, surfaces (upper surfaces) on a side in contact with metallic structures 94 have flat shapes and have shapes that do not protrude. In the case of the wavelength conversion units 93 of the second modified example, because light traveling toward the metallic structures 94 is reflected by flat surfaces of the metallic structures 94, much light L5 is emitted from a first substrate at a wide angle. Also, because this structure can be obtained by performing FIB processing on a laminated film of a material of the metallic structures 94 and a material of the wavelength conversion units 93 without aligning a photomask, manufacturing is simple.

Figure 27:
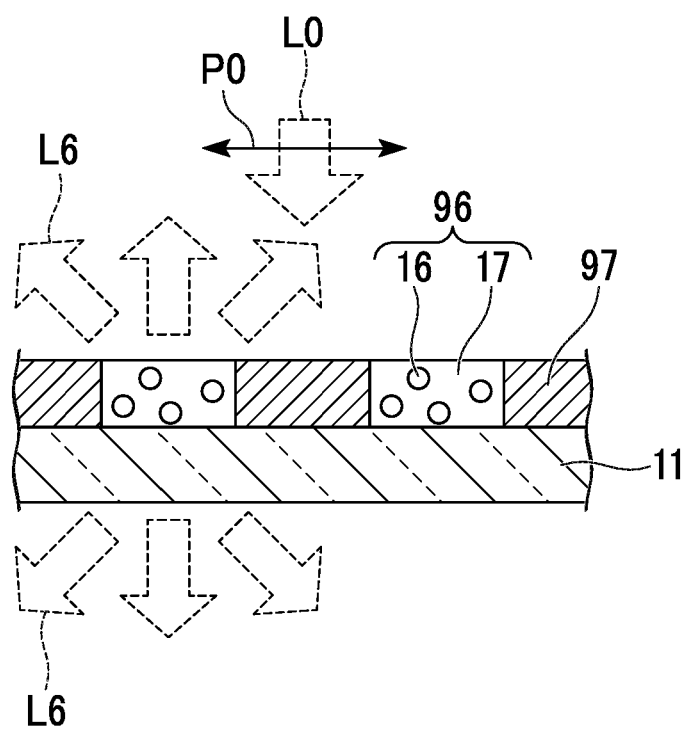
FIG. 27 is a cross-sectional view illustrating a third modified example of the wavelength conversion unit.

FIG. 27 is a cross-sectional view illustrating a third modified example of the wavelength conversion units.

As illustrated in FIG. 27, wavelength conversion units 96 of the third modified example do not have metallic structures 97 laminated on upper surfaces thereof, but are provided between adjacent metallic structures 97. In the case of the wavelength conversion units 96 of the third modified example, light L6 emitted from the wavelength conversion units 96 is emitted to both sides of a first substrate 11. By using this wavelength conversion substrate, application development to smart windows where display can be viewed from both sides can be expected.

Alternatively, in contrast to the configuration of the above-described embodiment, a configuration in which metallic structures are provided on one surface of the first substrate and wavelength conversion units including a wavelength conversion material are laminated on surfaces (upper surfaces) of the metallic structures opposite the first substrate may be adopted. Although an intensity of emitted light becomes small according to this configuration, external light directly excites a fluorescent substance and generation of light emission can be minimized because the external light is reflected by the metallic structures, for example, even if the external light (sunlight or the like) is incident from the first substrate 11. Thus, it is possible to reduce an emission color derived from a fluorescent substance in outdoor use. That is, when the configuration is used as a liquid-crystal display device, it is possible to obtain an effect that display color tones are improved.

Also, in all the above embodiments, an example in which a polarizer is provided only on the light incidence side of the liquid-crystal element has been described. However, in addition to the polarizer on the light incidence side, a polarizer may be provided on a light emission side of the liquid-crystal element. In this case, it is necessary to arrange the polarizer on the light emission side in a cross Nicol arrangement with respect to the polarizer on the light incident side. According to this configuration, black display in an electric field OFF state is enabled instead of the full transmission state in the electric field OFF state in the above embodiment.

In all the above-described embodiments, a transmission axis of the polarizer on the light incidence side is configured orthogonal to an extending direction of the metallic structures. Instead of this configuration, a configuration in which the transmission axis of the polarizer of the light incident side is arranged parallel to the extending direction of the metallic structures may be adopted. When this configuration is adopted, it is possible to implement a liquid-crystal display device which is in a full transmission state in an electric field ON state and which is in a specific wavelength band transmission state in an electric field OFF state in contrast to the above embodiment. With respect to this configuration, it is also possible to combine polarizers on the light emission side.

In addition, specific descriptions of the numbers, shapes, arrangements, materials, manufacturing processes, and the like of various constituent elements constituting a wavelength conversion substrate, a liquid-crystal element, a liquid-crystal module, and a liquid-crystal display device in the above embodiments can be appropriately changed. Also, a liquid-crystal module according to an aspect of the present invention can also be applied to applications other than liquid-crystal display devices, for example, illumination devices having a dimming function and the like.

INDUSTRIAL APPLICABILITY

Some aspects of the present invention can be applied to a wavelength conversion substrate, a liquid-crystal element, a liquid-crystal module, and a liquid-crystal display device.

DESCRIPTION OF REFERENCE SYMBOLS

1, 41, 51, 61, 71, 81 . . . Liquid-crystal display device
2 . . . Liquid-crystal module
3 . . . Light source
4, 44, 55, 64, 75, 85 . . . Liquid-crystal element
7, 42, 52, 62, 74, 84 . . . Wavelength conversion substrate
9 . . . Liquid-crystal layer
9B . . . Liquid-crystal molecules
10 . . . Electric field generation unit
11 . . . First substrate
12 . . . Light modulation unit
14, 90, 93, 96 . . . Wavelength conversion unit
15, 73R, 73G, 73B, 83, 91, 94, 97 . . . Metallic structure
15A . . . First metallic structure
15B . . . Second metallic structure
16 . . . Wavelength converting material
22 . . . Second substrate
72R, 82R . . . Red sub-pixel
72G, 82G . . . Green sub-pixel
72B, 82B . . . Blue sub-pixel

The invention claimed is:

1. A wavelength conversion substrate comprising:
a first substrate having an optical transparency; and
a plurality of light modulation units periodically provided at intervals from one another, the plurality of light modulation units being provided on one surface of the first substrate, the plurality of light modulation units being configured to modulate a spectrum of incident light in accordance with a polarization state of the incident light,
wherein each of the plurality of light modulation units comprises:
a metallic structure provided on one surface of the first substrate and configured to exhibit plasmon resonance due to the incident light, a period Λ of the plurality of metallic structures being 50 nm<Λ<350 nm; and
a wavelength conversion unit provided so that the wavelength conversion unit is adjacent to the metallic structure and comprising a wavelength converting material configured to emit light in a wavelength band different from a wavelength band of the incident light, wherein the wavelength conversion unit is provided between the metallic structure and the first substrate, and wherein a surface of the wavelength conversion unit has convex shape toward the metallic structure, the surface being in contact with the metallic structure.

2. The wavelength conversion substrate according to claim 1, wherein the wavelength conversion unit is provided between adjacent metallic structures.

3. The wavelength conversion substrate according to claim 1, wherein a resonance wavelength of the plasmon resonance exhibited in the metallic structure is within an absorption wavelength band of an absorption spectrum of the wavelength converting material.

4. The wavelength conversion substrate according to claim 1, wherein a material of the metallic structure is any one of gold, silver, aluminum, platinum, copper, indium, indium tin oxide, rhodium, and ruthenium.

5. A liquid-crystal element comprising:
the wavelength conversion substrate according to claim 1;
a second substrate;
a liquid-crystal layer provided between the wavelength conversion substrate and the second substrate; and
an electric field generation unit configured to control an alignment state of liquid-crystal molecules inside the liquid-crystal layer by generating an electric field in the liquid-crystal layer.

6. The liquid-crystal element according to claim 5, wherein the second substrate comprises an electrode, and wherein the electric field generation unit generates a vertical electric field between the metallic structure and the electrode.

7. The liquid-crystal element according to claim 5, wherein the first substrate comprises an electrode, and wherein the electric field generation unit generates a horizontal electric field between the metallic structure and the electrode.

8. A liquid-crystal module comprising:
the liquid-crystal element according to claim 5; and
a light source configured to radiate light to the liquid-crystal element.

9. A liquid-crystal display device comprising:
the liquid-crystal module according to claim 8.

* * * * *